US008259044B2

(12) United States Patent
Nathan et al.

(10) Patent No.: US 8,259,044 B2
(45) Date of Patent: Sep. 4, 2012

(54) METHOD AND SYSTEM FOR PROGRAMMING, CALIBRATING AND DRIVING A LIGHT EMITTING DEVICE DISPLAY

(75) Inventors: Arokia Nathan, Waterloo (CA); Gholamreza Reza Chaji, Waterloo (CA); Peyman Servati, Waterloo (CA)

(73) Assignee: Ignis Innovation Inc., Waterloo, Ontario (CA)

( * ) Notice: Subject to any disclaimer, the term of this patent is extended or adjusted under 35 U.S.C. 154(b) by 304 days.

(21) Appl. No.: 12/571,968

(22) Filed: Oct. 1, 2009

(65) Prior Publication Data

US 2010/0033469 A1    Feb. 11, 2010

Related U.S. Application Data

(63) Continuation of application No. 11/304,162, filed on Dec. 15, 2005, now Pat. No. 7,619,597.

(30) Foreign Application Priority Data

Dec. 15, 2004 (CA) .................................... 2490860
Apr. 8, 2005 (CA) .................................... 2503237
Jun. 8, 2005 (CA) .................................... 2509201
Oct. 17, 2005 (CA) .................................... 2521986

(51) Int. Cl.
   *G09G 3/32* (2006.01)
(52) U.S. Cl. ...................................... 345/82; 315/169.3
(58) Field of Classification Search .............. 345/76, 345/82, 204, 83, 211, 690; 315/169.3
   See application file for complete search history.

(56) References Cited

U.S. PATENT DOCUMENTS

| | | | |
|---|---|---|---|
| 3,506,851 A | 4/1970 | Polkinghorn et al. | 326/88 |
| 3,774,055 A | 11/1973 | Bapat et al. | 326/97 |
| 4,090,096 A | 5/1978 | Nagami | 327/173 |
| 4,354,162 A | 10/1982 | Wright | |
| 5,153,420 A | 10/1992 | Hack et al. | 250/208.1 |
| 5,204,661 A | 4/1993 | Hack et al. | 345/88 |
| 5,589,847 A | 12/1996 | Lewis | |
| 5,670,973 A | 9/1997 | Bassetti et al. | |
| 5,691,783 A | 11/1997 | Numao et al. | 349/48 |
| 5,744,824 A | 4/1998 | Kousai et al. | 257/74 |
| 5,748,160 A | 5/1998 | Shieh et al. | |
| 5,815,303 A | 9/1998 | Berlin | |
| 5,870,071 A | 2/1999 | Kawahata | 345/100 |
| 5,903,248 A | 5/1999 | Irwin | 345/90 |
| 5,949,398 A | 9/1999 | Kim | 345/100 |
| 6,097,360 A | 8/2000 | Holloman | |

(Continued)

FOREIGN PATENT DOCUMENTS

CA    1294034    1/1992
(Continued)

OTHER PUBLICATIONS

Ahnood et al.: "Effect of threshold voltage instability on field effect mobility in thin film transistors deduced from constant current measurements"; dated Aug. 2009.

(Continued)

*Primary Examiner* — Abbas Abdulselam
(74) *Attorney, Agent, or Firm* — Nixon Peabody LLP

(57) ABSTRACT

A method and system for programming, calibrating and driving a light emitting device display is provided. The system may include extracting a time dependent parameter of a pixel for calibration.

61 Claims, 26 Drawing Sheets

U.S. PATENT DOCUMENTS

| | | | |
|---|---|---|---|
| 6,229,506 B1 | 5/2001 | Dawson et al. | 345/82 |
| 6,229,508 B1 | 5/2001 | Kane | 345/82 |
| 6,246,180 B1 | 6/2001 | Nishigaki | 315/169.3 |
| 6,259,424 B1 | 7/2001 | Kurogane | |
| 6,288,696 B1 | 9/2001 | Holloman | |
| 6,320,325 B1 | 11/2001 | Cok et al. | |
| 6,414,661 B1 * | 7/2002 | Shen et al. | 345/82 |
| 6,417,825 B1 | 7/2002 | Stewart et al. | 345/77 |
| 6,475,845 B2 | 11/2002 | Kimura | 438/200 |
| 6,501,098 B2 | 12/2002 | Yamazaki | 257/72 |
| 6,501,466 B1 | 12/2002 | Yamagishi et al. | 345/204 |
| 6,522,315 B2 | 2/2003 | Ozawa et al. | 345/92 |
| 6,542,138 B1 | 4/2003 | Shannon et al. | 345/76 |
| 6,580,657 B2 | 6/2003 | Sanford et al. | |
| 6,583,398 B2 | 6/2003 | Harkin | 250/208.1 |
| 6,594,606 B2 | 7/2003 | Everitt | |
| 6,618,030 B2 | 9/2003 | Kane et al. | |
| 6,639,244 B1 | 10/2003 | Yamazaki et al. | 257/72 |
| 6,680,580 B1 | 1/2004 | Sung | 315/169.3 |
| 6,687,266 B1 | 2/2004 | Ma et al. | |
| 6,690,000 B1 | 2/2004 | Muramatsu et al. | 250/208.1 |
| 6,690,344 B1 | 2/2004 | Takeuchi et al. | |
| 6,693,388 B2 | 2/2004 | Oomura | |
| 6,693,610 B2 | 2/2004 | Shannon et al. | 345/76 |
| 6,697,057 B2 | 2/2004 | Koyama et al. | 345/204 |
| 6,720,942 B2 | 4/2004 | Lee et al. | |
| 6,724,151 B2 | 4/2004 | Yoo | 315/169.3 |
| 6,734,636 B2 | 5/2004 | Sanford et al. | 315/169.3 |
| 6,738,035 B1 | 5/2004 | Fan | |
| 6,753,655 B2 | 6/2004 | Shih et al. | 315/169.3 |
| 6,753,834 B2 | 6/2004 | Mikami et al. | 345/76 |
| 6,756,741 B2 | 6/2004 | Li | 315/169.3 |
| 6,756,952 B1 * | 6/2004 | Decaux et al. | 345/83 |
| 6,771,028 B1 | 8/2004 | Winters | |
| 6,777,712 B2 | 8/2004 | Sanford et al. | |
| 6,777,888 B2 | 8/2004 | Kondo | 315/169.3 |
| 6,781,567 B2 | 8/2004 | Kimura | 345/92 |
| 6,806,638 B2 | 10/2004 | Lih et al. | |
| 6,809,706 B2 | 10/2004 | Shimoda | |
| 6,828,950 B2 | 12/2004 | Koyama | 345/76 |
| 6,859,193 B1 | 2/2005 | Yumoto | 345/82 |
| 6,876,346 B2 | 4/2005 | Anzai et al. | 345/82 |
| 6,885,356 B2 * | 4/2005 | Hashimoto | 345/77 |
| 6,900,485 B2 | 5/2005 | Lee | 257/292 |
| 6,903,734 B2 | 6/2005 | Eu | 345/211 |
| 6,909,419 B2 | 6/2005 | Zavracky et al. | |
| 6,911,960 B1 | 6/2005 | Yokoyama | 345/76 |
| 6,911,964 B2 | 6/2005 | Lee et al. | 345/90 |
| 6,914,448 B2 | 7/2005 | Jinno | 324/750.3 |
| 6,924,602 B2 | 8/2005 | Komiya | 315/169.3 |
| 6,937,215 B2 | 8/2005 | Lo | |
| 6,937,220 B2 | 8/2005 | Kitaura et al. | 345/90 |
| 6,943,500 B2 | 9/2005 | LeChevalier | |
| 6,954,194 B2 | 10/2005 | Matsumoto et al. | 345/92 |
| 6,975,142 B2 | 12/2005 | Azami et al. | 326/88 |
| 6,995,510 B2 | 2/2006 | Murakami et al. | |
| 6,995,519 B2 | 2/2006 | Arnold et al. | |
| 7,027,015 B2 | 4/2006 | Booth, Jr. et al. | |
| 7,034,793 B2 | 4/2006 | Sekiya et al. | |
| 7,038,392 B2 | 5/2006 | Libsch et al. | 315/169.3 |
| 7,061,451 B2 | 6/2006 | Kimura | 345/76 |
| 7,071,932 B2 | 7/2006 | Libsch et al. | 345/211 |
| 7,106,285 B2 | 9/2006 | Naugler | |
| 7,122,835 B1 | 10/2006 | Ikeda et al. | 257/72 |
| 7,274,363 B2 | 9/2007 | Ishizuka et al. | |
| 7,315,295 B2 | 1/2008 | Kimura | 345/92 |
| 7,321,348 B2 | 1/2008 | Cok et al. | |
| 7,414,600 B2 | 8/2008 | Nathan et al. | 345/82 |
| 7,502,000 B2 | 3/2009 | Yuki et al. | |
| 7,535,449 B2 | 5/2009 | Miyazawa | |
| 7,554,512 B2 | 6/2009 | Steer | |
| 7,569,849 B2 | 8/2009 | Nathan et al. | 257/40 |
| 7,619,594 B2 | 11/2009 | Hu | |
| 7,619,597 B2 | 11/2009 | Nathan et al. | |
| 2001/0009283 A1 | 7/2001 | Arao et al. | 257/303 |
| 2001/0040541 A1 | 11/2001 | Yoneda et al. | 345/87 |
| 2001/0052940 A1 | 12/2001 | Hagihara et al. | 348/302 |
| 2002/0012057 A1 | 1/2002 | Kimura | 348/308 |
| 2002/0030190 A1 | 3/2002 | Ohtani et al. | 257/72 |
| 2002/0052086 A1 | 5/2002 | Maeda | 438/283 |
| 2002/0084463 A1 | 7/2002 | Sanford et al. | |
| 2002/0101172 A1 | 8/2002 | Bu | |
| 2002/0117722 A1 | 8/2002 | Osada et al. | 257/379 |
| 2002/0158587 A1 | 10/2002 | Komiya | 315/169.3 |
| 2002/0158666 A1 | 10/2002 | Azami et al. | 326/83 |
| 2002/0158823 A1 | 10/2002 | Zavracky et al. | |
| 2002/0186214 A1 | 12/2002 | Siwinski | |
| 2002/0190971 A1 | 12/2002 | Nakamura et al. | |
| 2002/0195967 A1 | 12/2002 | Kim et al. | |
| 2003/0020413 A1 | 1/2003 | Oomura | |
| 2003/0030603 A1 | 2/2003 | Shimoda | |
| 2003/0076048 A1 | 4/2003 | Rutherford | |
| 2003/0151569 A1 | 8/2003 | Lee et al. | |
| 2003/0179626 A1 | 9/2003 | Sanfod et al. | |
| 2004/0066357 A1 | 4/2004 | Kawasaki | |
| 2004/0135749 A1 | 7/2004 | Kondakov et al. | |
| 2004/0179627 A1 | 9/2004 | Shirasaki et al. | |
| 2004/0183759 A1 | 9/2004 | Stevenson et al. | |
| 2004/0257353 A1 | 12/2004 | Imamura et al. | 345/204 |
| 2004/0257355 A1 | 12/2004 | Naugler | |
| 2005/0110420 A1 | 5/2005 | Arnold et al. | |
| 2005/0140610 A1 | 6/2005 | Smith et al. | |
| 2005/0145891 A1 | 7/2005 | Abe | |
| 2005/0156831 A1 | 7/2005 | Yamazaki et al. | |
| 2006/0038758 A1 | 2/2006 | Routley et al. | |
| 2006/0232522 A1 | 10/2006 | Roy et al. | |
| 2007/0080908 A1 | 4/2007 | Nathan et al. | |
| 2007/0182671 A1 | 8/2007 | Nathan et al. | |

FOREIGN PATENT DOCUMENTS

| | | |
|---|---|---|
| CA | 2368386 | 9/1999 |
| CA | 2498136 | 3/2004 |
| CA | 2522396 | 11/2004 |
| CA | 2443206 | 3/2005 |
| CA | 2443206 A1 | 3/2005 |
| CA | 2472671 | 12/2005 |
| CA | 2567076 | 1/2006 |
| EP | 1028471 | 8/2000 |
| EP | 1 194 013 | 3/2002 |
| EP | 1 335 430 A1 | 8/2003 |
| EP | 1 381 019 | 1/2004 |
| EP | 1 521 203 A2 | 4/2005 |
| JP | 10-254410 | 9/1998 |
| JP | 2002-278513 | 9/2002 |
| JP | 2003-076331 | 3/2003 |
| JP | 2003/308046 | 10/2003 |
| JP | 2004-145197 | 5/2004 |
| KR | 2004-0100887 | 12/2004 |
| WO | WO 98/48403 | 10/1998 |
| WO | 9948079 | 9/1999 |
| WO | 01/27910 A1 | 4/2001 |
| WO | 03/034389 | 4/2003 |
| WO | 03/063124 | 7/2003 |
| WO | 2004/003877 | 1/2004 |
| WO | 2004/034364 | 4/2004 |
| WO | WO 2004/047058 | 6/2004 |
| WO | 2005/022498 | 3/2005 |
| WO | 2005/055185 | 6/2005 |
| WO | 2006/063448 | 6/2006 |

OTHER PUBLICATIONS

Alexander et al.: "Pixel circuits and drive schemes for glass and elastic AMOLED displays"; dated Jul. 2005 (9 pages).

Ashtiani et al.: "AMOLED Pixel Circuit With Electronic Compensation of Luminance Degradation"; dated Mar. 2007 (4 pages).

Chahi et al.: "An Enhanced and Simplified Optical Feedback Pixel Circuit for AMOLED Displays"; dated Oct. 2006.

Chaji et al.: "A Current-Mode Comparator for Digital Calibration of Amorphous Silicon AMOLED Displays"; dated Jul. 2008 (5 pages).

Chaji et al.: "A Low-Cost Stable Amorphous Silicon AMOLED Display with Full V~T- and V~O~L~E~D Shift Compensation"; dated May 2007 (4 pages).

Chaji et al.: "A low-power driving scheme for a-Si:H active-matrix organic light-emitting diode displays"; dated Jun. 2005 (4 pages).

Chaji et al.: "A low-power high-performance digital circuit for deep submicron technologies"; dated Jun. 2005 (4 pages).

Chaji et al.: "A novel a-Si:H AMOLED pixel circuit based on short-term stress stability of a-Si:H TFTs"; dated Oct. 2005 (3 pages).
Chaji et al.: "A Novel Driving Scheme and Pixel Circuit for AMOLED Displays"; dated Jun. 2006 (4 pages).
Chaji et al.: "A novel driving scheme for high-resolution large-area a-Si:H AMOLED displays"; dated Aug. 2005 (4 pages).
Chaji et al.: "A Stable Voltage-Programmed Pixel Circuit for a-Si:H AMOLED Displays"; dated Dec. 2006 (12 pages).
Chaji et al.: "A Sub-μA fast-settling current-programmed pixel circuit for AMOLED displays"; dated Sep. 2007.
Chaji et al.: "Compensation technique for DC and transient instability of thin film transistor circuits for large-area devices"; dated Aug. 2008.
Chaji et al.: "Driving scheme for stable operation of 2-TFT a-Si AMOLED pixel"; dated Apr. 2005 (2 pages).
Chaji et al.: "Dynamic-effect compensating technique for stable a-Si:H AMOLED displays"; dated Aug. 2005 (4 pages).
Chaji et al.: "Electrical Compensation of OLED Luminance Degradation"; dated Dec. 2007 (3 pages).
Chaji et al.: "eUTDSP: a design study of a new VLIW-based DSP architecture"; dated My 2003 (4 pages).
Chaji et al.: "Fast and Offset-Leakage Insensitive Current-Mode Line Driver for Active Matrix Displays and Sensors"; dated Feb. 2009 (8 pages).
Chaji et al.: "High Speed Low Power Adder Design With a New Logic Style: Pseudo Dynamic Logic (SDL)"; dated Oct. 2001 (4 pages).
Chaji et al.: "High-precision, fast current source for large-area current-programmed a-Si flat panels"; dated Sep. 2006 (4 pages).
Chaji et al.: "Low-Cost AMOLED Television with IGNIS Compensating Technology"; dated May 2008 (4 pages).
Chaji et al.: "Low-Cost Stable a-Si:H AMOLED Display for Portable Applications"; dated Jun. 2006 (4 pages).
Chaji et al.: "Low-Power Low-Cost Voltage-Programmed a-Si:H AMOLED Display"; dated Jun. 2008 (5 pages).
Chaji et al.: "Merged phototransistor pixel with enhanced near infrared response and flicker noise reduction for biomolecular imaging"; dated Nov. 2008.
Chaji et al.: "Parallel Addressing Scheme for Voltage-Programmed Active-Matrix OLED Displays"; dated May 2007 (6 pages).
Chaji et al.: "Pseudo dynamic logic (SDL): a high-speed and low-power dynamic logic family"; dated 2002 (4 pages).
Chaji et al.: "Stable a-Si:H circuits based on short-term stress stability of amorphous silicon thin film transistors"; dated May 2006 (4 pages).
Chaji et al.: "Stable Pixel Circuit for Small-Area High-Resolution a-Si:H AMOLED Displays"; dated Oct. 2008 (5 pages).
Chaji et al.: "Thin-Film Transistor Integration for Biomedical Imaging and AMOLED Displays"; dated 2008 (177 pages).
European Search Report for European Application No. EP 05 81 9617 dated Jan. 30, 2009.
Goh et al., "A New a-Si:H Thin Film Transistor Pixel Circul for Active-Matrix Organic Light-Emitting Diodes", IEEE Electron Device Letters, vol. 24, No. 9, Sep. 2003, 4 pages.
Jafarabadiashtiani et al.: "A New Driving Method for a-Si AMOLED Displays Based on Voltage Feedback"; dated 2005 (4 pages).
Lee et al.: "Ambipolar Thin-Film Transistors Fabricated by PECVD Nanocrystalline Silicon"; dated 2006 (6 pages).
Matsueda y et al.: "35.1: 2.5-in. AMOLED with Integrated 6-bit Gamma Compensated Digital Data Driver"; dated May 2004.
Nathan et al., "Amorphous Silicon Thin Film Transistor Circuit Integration for Oganic LED Displays on Glass and Plastic", IEEE Journal of Solid-State Circuits, vol. 39, No. 9, Sep. 2004, 12 pages.

Nathan et al.: "Backplane Requirements for Active Matrix Organic Light Emitting Diode Displays"; dated 2006 (16 pages).
Nathan et al.: "Call for papers second international workshop on compact thin-film transistor (TFT) modeling for circuit simulation"; dated Sep. 2009 (1 page).
Nathan et al.: "Driving schemes for a-Si and LTPS AMOLED displays"; dated Dec. 2005 (11 pages).
Nathan et al.: "Invited Paper: a -Si for AMOLED—Meeting the Performance and Cost Demands of Display Applications (Cell Phone to HDTV)"; dated 2006 (4 pages).
Philipp: "Charge transfer sensing" Sensor Review, vol. 19, No. 2, Dec. 31, 1999, 10 pages.
Rafati et al.: "Comparison of a 17 b multiplier in Dual-rail domino and in Dual-rail D L (D L) logic styles"; dated 2002 (4 pages).
Safavaian et al.: "Three-TFT image sensor for real-time digital X-ray imaging"; dated Feb. 2, 2006 (2 pages).
Safavian et al.: "3-TFT active pixel sensor with correlated double sampling readout circuit for real-time medical x-ray imaging"; dated Jun. 2006 (4 pages).
Safavian et al.: "A novel current scaling active pixel sensor with correlated double sampling readout circuit for real time medical x-ray imaging"; dated May 2007 (7 pages).
Safavian et al.: "A novel hybrid active-passive pixel with correlated double sampling CMOS readout circuit for medical x-ray imaging"; dated May 2008 (4 pages).
Safavian et al.: "Self-compensated a-Si:H detector with current-mode readout circuit for digital X-ray fluoroscopy"; dated Aug. 2005 (4 pages).
Safavian et al.: "TFT active image sensor with current-mode readout circuit for digital x-ray fluoroscopy [5969D-82]"; dated Sep. 2005 (9 pages).
Vygranenko et al.: "Stability of indium-oxide thin-film transistors by reactive ion beam assisted deposition"; dated 2009.
Wang et al.: "Indium oxides by reactive ion beam assisted evaporation: From material study to device application"; dated Mar. 2009 (6 pages).
Yi He et al., "Current-Source a-Si:H Thin Film Transistor Circuit for Active-Matrix Organic Light-Emitting Displays", IEEE Electron Device Letters, vol. 21, No. 12, Dec. 2000, pp. 590-592.
Eric R. Fossum. "Active Pixel Sensors: Are CCD's Dinosaurs?" SPIE: Symposium on Electronic Imaging. Feb. 1, 1993 (13 pages).
Kanicki, J. et al. "Amorphous Silicon Thin-Film Transistors Based Active-Matrix Organic Light-Emitting Displays." Asia Display: International Display Workshops, Sep. 2001 (pp. 315-318).
Karim, K. S. et al. "Amorphous Silicon Active Pixel Sensor Readout Circuit for Digital Imaging." IEEE: Transactions on Electron Devices. vol. 50, No. 1, Jan. 2003 (pp. 200-208).
Mendes E. et al. "A High Resolution Switch-Current Memory Base Cell." IEEE: Circuits and Systems. vol. 2, Aug. 1999 (pp. 718-721).
Partial European Search Report mailed Sep. 22, 2011 issued in corresponding European Patent Application No. 11168677.0 (5 pages).
Extended European Search Report mailed Feb. 12, 2009 issued in corresponding European Patent Application No. 05819617.1 (9 pages).
International Search Report mailed Mar. 21, 2006 issued in corresponding International Patent Application No. PCT/CA2005/001897 (2 pages).
Written Opinion mailed Mar. 21, 2006 issued in corresponding International Patent Application No. PCT/CA2005/001897 (4 pages).

* cited by examiner

METHOD AND SYSTEM FOR PROGRAMMING, CALIBRATING AND DRIVING A LIGHT EMITTING DEVICE DISPLAY

FIELD OF INVENTION

The present invention relates to display technologies, more specifically a method and system for programming, calibrating and driving a light emitting device display.

BACKGROUND OF THE INVENTION

Recently active-matrix organic light-emitting diode (AMOLED) displays with amorphous silicon (a-Si), poly-silicon, organic, or other driving backplane have become more attractive due to advantages over active matrix liquid crystal displays. For example, the advantages include: with a-Si besides its low temperature fabrication that broadens the use of different substrates and makes feasible flexible displays, its low cost fabrication, high resolution, and a wide viewing angle.

An AMOLED display includes an array of rows and columns of pixels, each having an organic light-emitting diode (OLED) and backplane electronics arranged in the array of rows and columns. Since the OLED is a current driven device, the pixel circuit of the AMOLED should be capable of providing an accurate and constant drive current.

U.S. Pat. No. 6,594, 606 discloses a method and system for calibrating passive pixels. U.S. Pat. No. 6,594, 606 measures data line voltage and uses the measurement for pre-charge. However, this technique does not provide the accuracy needed for active matrix, since the active matrix calibration should work for both backplane aging and OLED aging. Further, after pre-charge, current programming must be performed. Current-programming of current driven pixels is slow due to parasitic line capacitances and suffers from non-uniformity for large displays. The speed may be an issue when programming with small currents.

Other compensation techniques have been introduced. However, there is still a need to provide a method and system which is capable of providing constant brightness, achieving high accuracy and reducing the effect of the aging of the pixel circuit.

SUMMARY OF THE INVENTION

It is an object of the invention to provide e method and system that obviates or mitigates at least one of the disadvantages of existing systems.

In accordance with an aspect of the present invention there is provided a method of real-time calibration for a display array having a plurality of pixel circuits arranged in row and column, including the steps of: generating a priority list of pixels, which is used to prioritize pixels for calibration based on display and previous calibration data, the priority list being used to select one or more (n) pixels which are programmed with currents higher than a threshold current for calibration; selecting n pixels in a selected column of the display array from the linked list; implementing programming to the pixels in the selected column, including: monitoring a pixel current for the n pixels and obtaining calibration data; updating a compensation memory based on the calibration data for calibration; sorting the priority list for the next programming.

In accordance with a further aspect of the present invention there is provided a system for real-time calibration for a display array having a plurality of pixel circuits arranged in row and column, each pixel circuit having a light emitting device and a driving transistor, the system including: a calibration scheduler for controlling programming and calibration of the display array, including: a priority list for listing one or more pixels for calibration based on display data; module for enabling, during a programming cycle, calibration mode for one or more pixels in the selected column, which are selected from the priority list, and during a programming cycle, enabling normal operation mode for the rest of the pixels in the selected column; a monitor for monitoring a pixel current for the pixels in the calibration mode through the selected column; a generator for generating a calibration data based on the monitoring result; a memory for storing calibration data; and an adjuster for adjusting a programming data applied to the display array based on the calibration data when the pixel on the normal operation mode is programmed.

In accordance with a further aspect of the present invention there is provided a system for a display array having a pixel circuit, the pixel circuit being programmed through a data line, the system including: a data source for providing a programming data into the pixel circuit; a current-controlled voltage source associated with the voltage source for converting a current on the data line to a voltage associated with the current to extract a time dependent parameter of the pixel circuit.

In accordance with a further aspect of the present invention there is provided a system for a display array including a plurality of pixel circuits, each pixel circuit including a driving transistor, at least one switch transistor, a storage capacitor and a light emitting device, the system including: a monitor for monitoring a current or voltage on the pixel circuit; a data process unit for controlling the operation of the display array, the data process unit extracting information on an aging of the pixel circuit, based on the monitored current or voltage and determining a state of the pixel circuit; a driver controlled by the data process unit and for providing programming and calibration data to the pixel circuit, based on the state of the pixel circuit.

In accordance with a further aspect of the present invention there is provided a method of driving a display array, the display array including a plurality of pixel circuits, each pixel circuit including a driving transistor, at least one switch transistor, a storage capacitor and a light emitting device, the method including the steps of: applying a current or voltage to the pixel circuit; monitoring a current or voltage flowing through the pixel circuit; extracting information on an aging of the pixel circuit, based on the monitored current or voltage and determining the state of the pixel circuit; providing operation voltage to the pixel circuit, including determining programming and calibration data for the pixel circuit based on the state of the pixel circuit.

In accordance with a further aspect of the present invention there is provided a method of driving a display array, the display array including a plurality of pixel circuits, each pixel circuit including a driving transistor, at least one switch transistor, a storage capacitor and a light emitting device, the method including the steps of: applying a current or voltage to the light emitting device; monitoring a current or voltage flowing through the light emitting device; predicting a shift in the voltage of the light emitting device, based on the monitored current or voltage and determining the state of the pixel circuit; and providing, to the light emitting device, a bias associated with the shift in the voltage of the light emitting device.

In accordance with a further aspect of the present invention there is provided a system for driving a display array, the display array including a plurality of pixel circuits, each pixel circuit including a driving transistor, at least one switch transistor, a storage capacitor and a light emitting device, the system including: a monitor for monitoring a current or voltage on the pixel circuit; a data process unit for predicting a shift in the voltage of the light emitting device, based on the monitored current or voltage and determining the state of the pixel circuit; and a circuit for providing, to the light emitting device, a bias associated with the shift in the voltage of the light emitting device.

In accordance with an aspect of the present invention there is provided a system for a display array including a plurality of pixel circuits, each pixel circuit having a driving transistor, at least one switch transistor, a storage capacitor and a light emitting device, the light emitting device being located at a programming path for programming the pixel circuit, the system including: a controller for controlling the operation of the display array; a driver for providing operation voltage to the pixel circuit based on the control of the controller; and the driver providing the operation voltage to the pixel circuit during a programming cycle such that the light emitting device being removed from the programming path.

This summary of the invention does not necessarily describe all features of the invention.

Other aspects and features of the present invention will be readily apparent to those skilled in the art from a review of the following detailed description of preferred embodiments in conjunction with the accompanying drawings.

BRIEF DESCRIPTION OF THE DRAWINGS

These and other features of the invention will become more apparent from the following description in which reference is made to the appended drawings wherein.

DETAILED DESCRIPTION OF THE PREFERRED EMBODIMENTS OF THE INVENTION

Embodiments of the present invention are described using a pixel including a light emitting device and a plurality of transistors. The light emitting device may be an organic light emitting diode (OLED). It is noted that "pixel" and "pixel circuit" may be used interchangeably.

Figure 1:
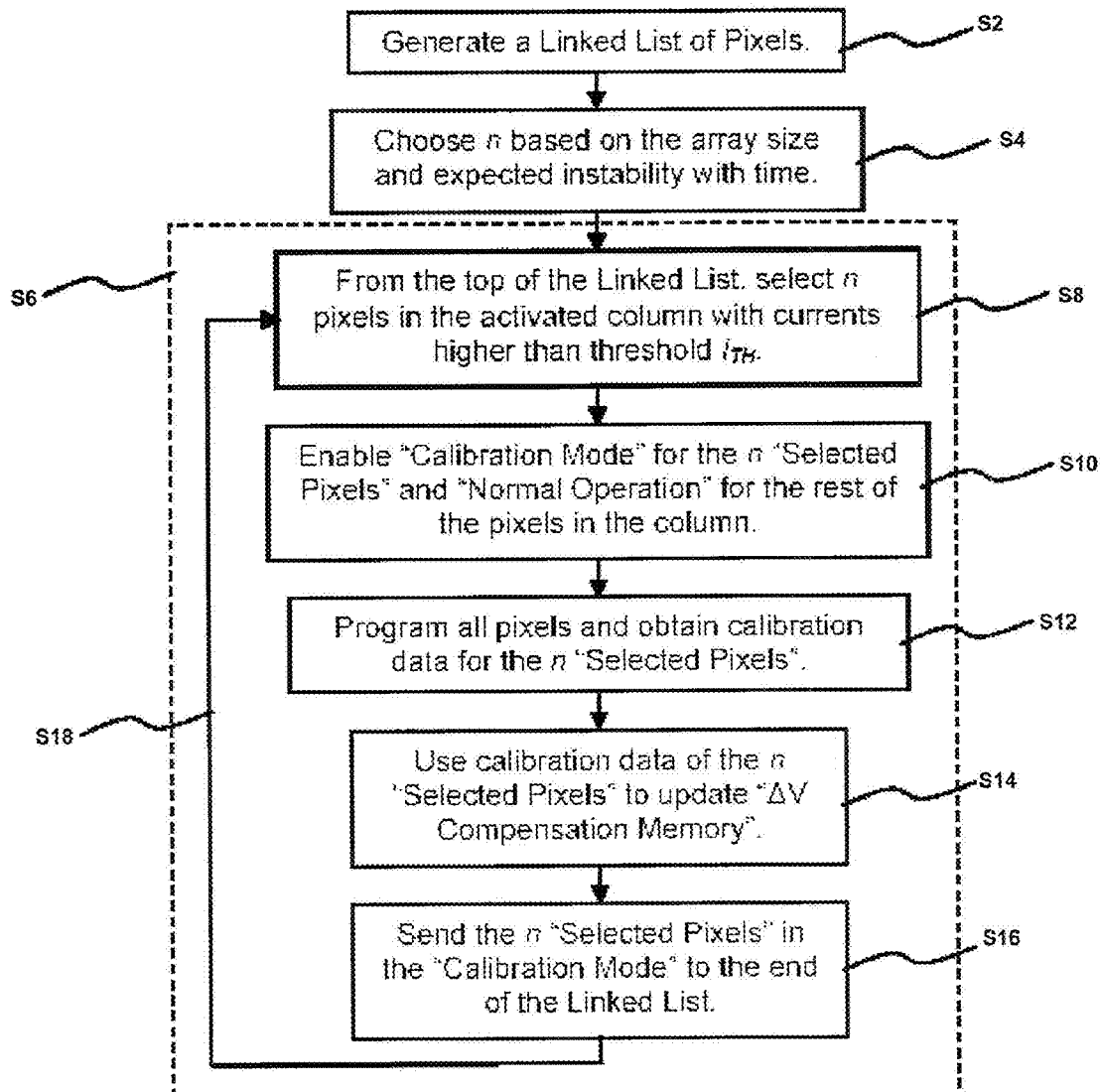
FIG. 1 is a flow chart showing a process for calibration-scheduling in accordance with an embodiment of the present invention.

Real-time calibration-scheduling for a display array having a plurality of pixels is described in detail. FIG. 1 illustrates a process for a calibration-scheduling in accordance with an embodiment of the present invention. According to this technique, the pixels are calibrated based on their aging and/or usage during the normal operation of the display array.

A linked list of pixels is generated in step S2. The linked list contains an identification of a pixel with high brightness for calibration. The linked list is used to schedule the priority in calibration.

In step S4, "n" is chosen based on the display size and expected instability with time (e.g. shift in characteristics of transistors and light emitting device). "n" represents the number of pixels that are calibrated in each programming cycle. "n" may be one or more than one.

Then programming cycle starts at step S6. The step S6 includes steps S8-S16. The steps S8-S16 are implemented on a selected column of the display array.

In step S8, "n" pixels in the selected column are selected from the beginning of the linked list, hereinafter referred to as "Selected Pixels".

In step S10, "Calibration Mode" is enabled for the Selected Pixels, and "Normal Operation Mode" is enabled for the rest of the pixels in the selected column of the display array.

In step S12, all pixels in the selected column are programmed by a voltage source driver (e.g. 28 of FIG. 2) which is connected to a data line of the pixel.

For the Selected Pixels, current flowing through the data line is monitored during the programming cycle. For the pixels other than the Selected Pixels in the selected column, the corresponding programming voltage is boosted using data stored in a memory (e.g. 34 of FIG. 2), hereinafter referred to as "ΔV compensation memory".

In step S14, the monitored current is compared with the expected current that must flow through the data line. Then, a calibration data curve for the Selected Pixels is generated. The ΔV compensation memory is updated based on the calibration data curve.

The calibration data curve stored in the ΔV compensation memory for a pixel will be used to boost programming voltage for that pixel in the next programming cycles when that pixel is in the Normal Operation Mode.

In step S16, the identifications of the Selected Pixels are sent to the end of the linked list. The Selected Pixels have the lowest priority in the linked list for calibration.

During display operation (S6-S16), the linked list will provide a sorted priority list of pixels that must be calibrated. It is noted that in the description, the term "linked list" and the term "priority list" may be used interchangeably.

The operation goes back (S18) to the step S8. The next programming cycle starts. A new column in the display array is activated (selected), and, new "n" pixels in the new activated column are selected from the top of the linked list. The ΔV compensation memory is updated using the calibration data obtained for the new Selected Pixels.

The number of the Selected Pixels, "n", is now described in detail. As described above, the number "n" is determined based on the display size and expected instability in device characteristics with time. It is assumed that the total number of pixels N is $N=3 \times m_1 \times m_2$, where $m_1$ and $m_2$ are the number of rows and columns in the display, respectively.

The highest rate in characteristics shift is K ($=\Delta I/\Delta t.I$). Each programming cycle takes $t=1/f.m_2$. The maximum expected shift in characteristics after the entire display is calibrated is $\Delta I/I=K.t.N/n<e$, where e is the allowed error. After this the calibration can be redone from the beginning, and the error is eliminated. This shows that $n>K.t.N/e$ or $n>3.K.m_1/f.e$. For instance, if $K=1\%/hr$, $m_1=1024$, $f=60$ Hz, and $e=0.1\%$, then $n>0.14$, which implies that it is needed to calibrate once in 5 programming cycles. This is achievable with one calibration unit, which operates only one time in 5 programming cycles. Each calibration unit enables calibration of one pixel at a programming cycle. If $e=0.01\%$, $n>1.4$. This means that two calibration units calibrating two pixels in each programming cycle are required. This shows that it is feasible to implement this calibration system with very low cost.

The frequency of calibration can be reduced automatically as the display ages, since shifts in characteristics will become slower as the time progresses. In addition, the pixels that are selected for calibration can be programmed with different currents depending on display data. The only condition is that their programming current is larger than a reference current. Therefore, the calibration can be performed at multiple brightness levels for one pixel to achieve higher accuracy.

The linked list is described in detail. In the linked list, the pixels with high brightness for calibration are listed. The display data is used to determine the pixels with high brightness for calibration. Calibration at low currents is slow and often not accurate. In addition, maximum shift in characteristics occurs for pixels with high current. Thus, in order to improve the accuracy and speed of calibration, the pixels, which must be programmed with currents higher than a threshold current $I_{TH}$, are selected and stored in the linked list.

$I_{TH}$ is a variable and may be "0". For $I_{TH}=0$, all pixels are listed in the linked list, and the calibration is performed for all pixels irrespective of their programming current.

The calibration-scheduling technique described above is applicable to any current programmed pixels, for example, but not limited to, a current mirror based pixel.

Figure 2:
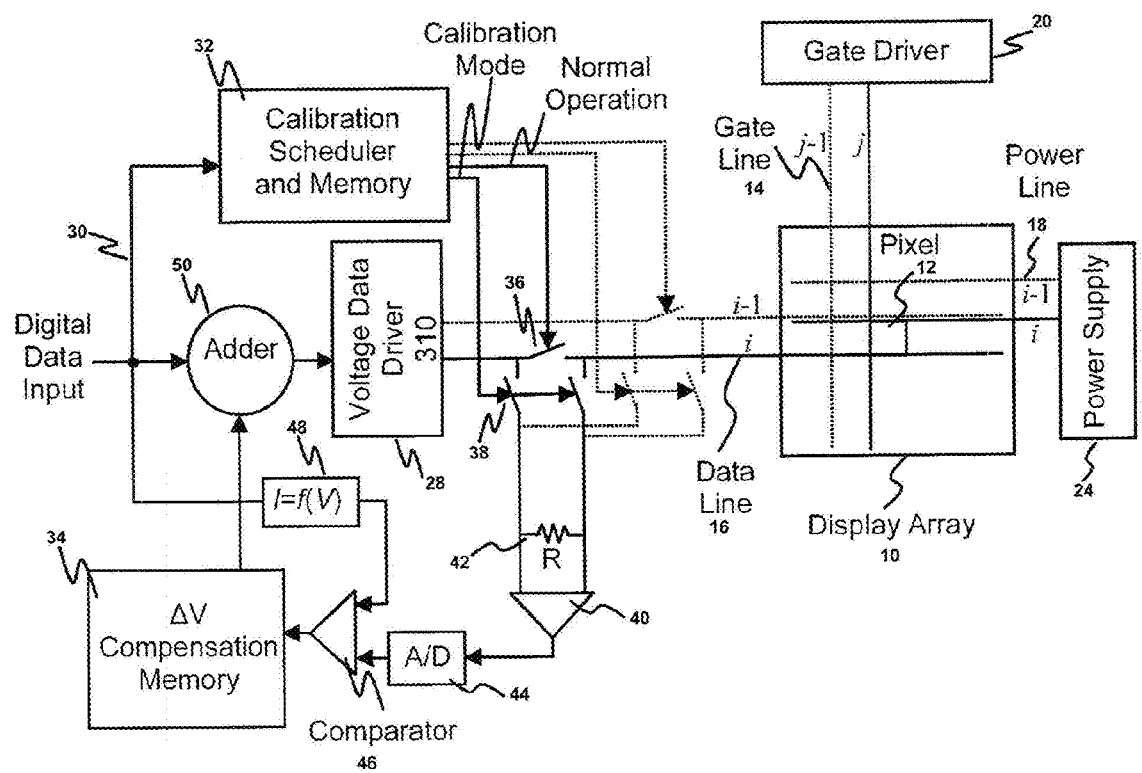
FIG. 2 is a diagram showing an example of a system structure for implementing the calibration-scheduling of FIG. 1.

FIG. 2 illustrates an example of a system structure for implementing the calibration-scheduling of FIG. 1. A system 30 of FIG. 2 for implementing calibration-scheduling algorithm is provided to a display array 10 having a plurality of pixel circuits 12. The pixel circuit 12 is a current programmed pixel circuit, such as, but not limited to a current mirror based pixel. The pixel circuits 12 are arranged in row and column.

The pixel circuit 12 may include an OLED and a plurality of transistors (e.g. TFTs). The transistor may be fabricated using amorphous silicon, nano/micro crystalline silicon, poly silicon, organic semiconductors technologies (e.g. organic TFT), NMOS/PMOS technology or CMOS technology (e.g. MOSFET). The display array 10 may be an AMOLED display array.

The pixel circuit 12 is operated by a gate line 14 connected to a gate driver 20, a data line 16 connected to a voltage data driver 28, and a power line connected to a power supply 24. In FIG. 2, two data lines, two gate lines and two power lines are shown as an example. It is apparent that more than two data lines, two gate lines and two power lines may be provided to the display array 10.

The system 30 includes a calibration scheduler and memory block 32 for controlling programming and calibration of the display array 10, and a ΔV compensation memory 34 for storing ΔV compensation voltage (value). In each programming cycle, a column of the display array 10 is selected. The calibration scheduler and memory block 32 enables Normal Operation Mode or Calibration Mode for the selected column (i.e., data line) during that programming cycle.

The system 30 further includes a monitoring system for monitoring and measuring a pixel current. The monitoring system includes switches 36 and 38 and a voltage sensor 40 with an accurate resistor 42. In FIG. 2, the switches 36 and 38 are provided for each data line as an example.

The system 30 further includes a generator for generating ΔV compensation voltage based on the monitoring result. The generator includes an analog/digital converter (A/D) 44, a comparator 46, and a translator 48. The A/D 44 converts the analog output of the voltage sensor 40 into a digital output. The comparator 46 compares the digital output to an output from the translator 48. The translator 48 implements function f(V) on a digital data input 52. The translator 48 converts the current data input 52 to the voltage data input through f(v). The result of the comparison by the comparator 46 is stored in the ΔV compensation memory 34.

The system 30 further includes an adder 50 for adding the digital data input 52 and the ΔV compensation voltage stored in the ΔV compensation memory 34. The voltage data driver 28 drives a data line based on the output of the adder 50. The programming data for the data line is adjusted by adding the ΔV compensation voltage.

When the calibration scheduler and memory block 32 enables the Normal Operation Mode for a selected data line, the switch 36 is activated. The voltage output from the voltage data driver 28 is directly applied to the pixel on that data line.

When the calibration scheduler and memory block 32 enables the Calibration Mode for that data line, the switch 38 is activated. The voltage is applied to the pixel on that data line through the accurate resistor 42. The voltage drop across the resistor 42 at the final stages of the programming time (i.e. when initial transients are finished) is measured by the voltage sensor 40. The voltage drop monitored by the voltage sensor 40 is converted to digital data by the A/D 44. The resulting value of the voltage drop is proportional to the current flowing through the pixel if the pixel is a current programmed pixel circuit. This value is compared by the comparator 46 to the expected value obtained by the translator 48.

The difference between the expected value and the measured value is stored in the ΔV compensation memory 34, and will be used for a subsequent programming cycle. The difference will be used to adjust the data voltage for programming of that pixel in future.

The calibration scheduler and memory block 32 may include the linked list described above. In the beginning, the linked list is generated automatically. It may be just a list of pixels. However, during the operation it is modified.

The calibration of the pixel circuits with high brightness guarantees the high speed and accurate calibration that is needed in large or small area displays.

Since the display array 10 is driven using a voltage programming technique, it is fast and can be used for high-resolution and large area displays.

Due to speed, accuracy, and ease of implementation, the applications of the calibration-scheduling technique ranges from electroluminescent devices used for cellphones, personal organizers, monitors, TVs, to large area display boards.

The system 30 monitors and measures voltage drop which depends on time dependent parameters of the pixel, and generates a desirable programming data. However, the time dependent parameters of the pixel may be extracted by any mechanisms other than that of FIG. 2.

A further technique for programming, extracting time dependent parameters of a pixel and driving the pixel is described in detail with reference to FIGS. 3-7. This technique includes voltage-extracting for calibration. Programming data is calibrated with the extracted information, resulting in a stable pixel current over time. Using this technique, the aging of the pixel is extracted.

Figure 3:
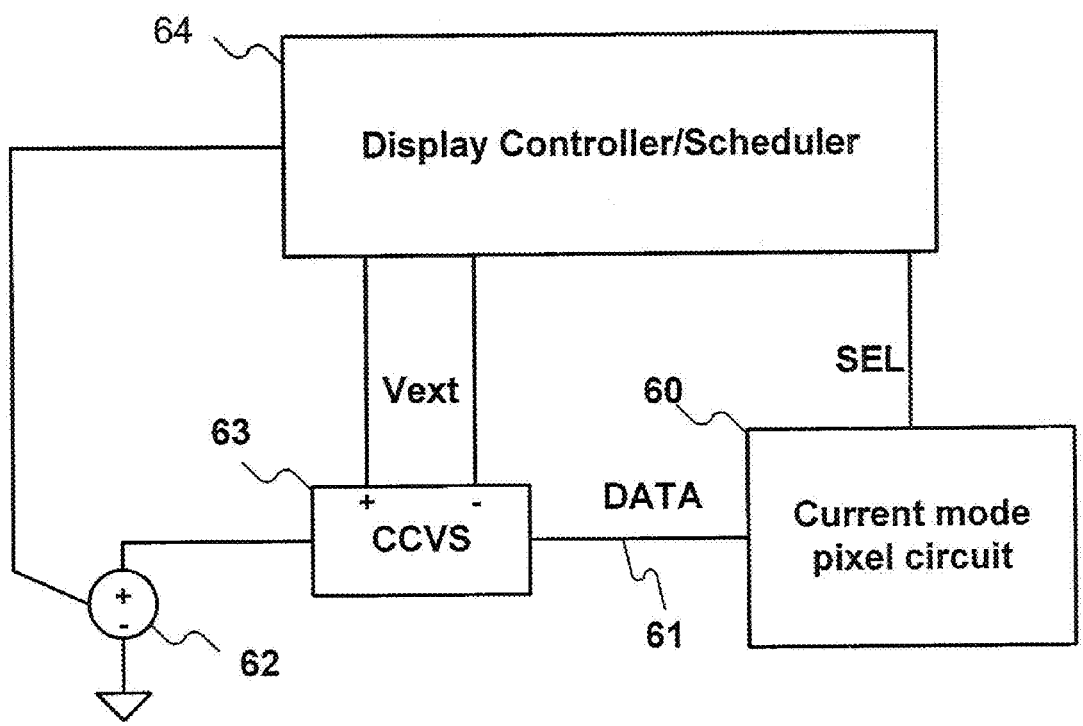
FIG. 3 is a diagram showing a system architecture for a voltage-extracting, programming and driving in accordance with an embodiment of the present invention.

FIG. 3 illustrates a system architecture for implementing a voltage-extracting, programming and driving in accordance with an embodiment of the present invention. The system of FIG. 3 implements the voltage-extracting and programming to a current mode pixel circuit 60. The pixel circuit 60 includes a light emitting device and a plurality of transistors having a driving transistor (not shown). The transistors may be TFTs.

The pixel circuit 60 is selected by a select line SEL and is driven by DATA on a data line 61. A voltage source 62 is provided to write a programming voltage $V_P$ into the pixel circuit 60. A current-controlled voltage source (CCVS) 63 having a positive node and a negative node is provided to convert the current on the data line 61 to a voltage Vext. A display controller and scheduler 64 operates the pixel circuit 60. The display controller and scheduler 64 monitors an extracted voltage Vext output from the CCVS 63 and then controls the voltage source 62.

The resistance of CCVS 63 is negligible. Thus the current on the data line 61 is written as:

$$I_{Line}=I_{piexl}=\beta(V_P-V_T)^2 \qquad (1)$$

where $I_{Line}$ represents the current on the data line 61, $I_{piexl}$ represents a pixel current, $V_T$ represents the threshold voltage of the driving transistor included in the pixel circuit 60, and β represents the gain parameter in the TFT characteristics.

As the threshold voltage of the driving TFT increases during the time, the current on the data line 61 decreases. By monitoring the extracted voltage Vext, the display controller and scheduler 64 determines the amount of shift in the threshold voltage.

The threshold voltage $V_T$ of the driving transistor can be calculate as:

$$V_T=V_P-(I_{Line}/\beta)^{0.5} \qquad (2)$$

The programming voltage $V_P$ is modified with the extracted information. The extraction procedure can be implemented for one or several pixels during each frame time.

Figure 4:
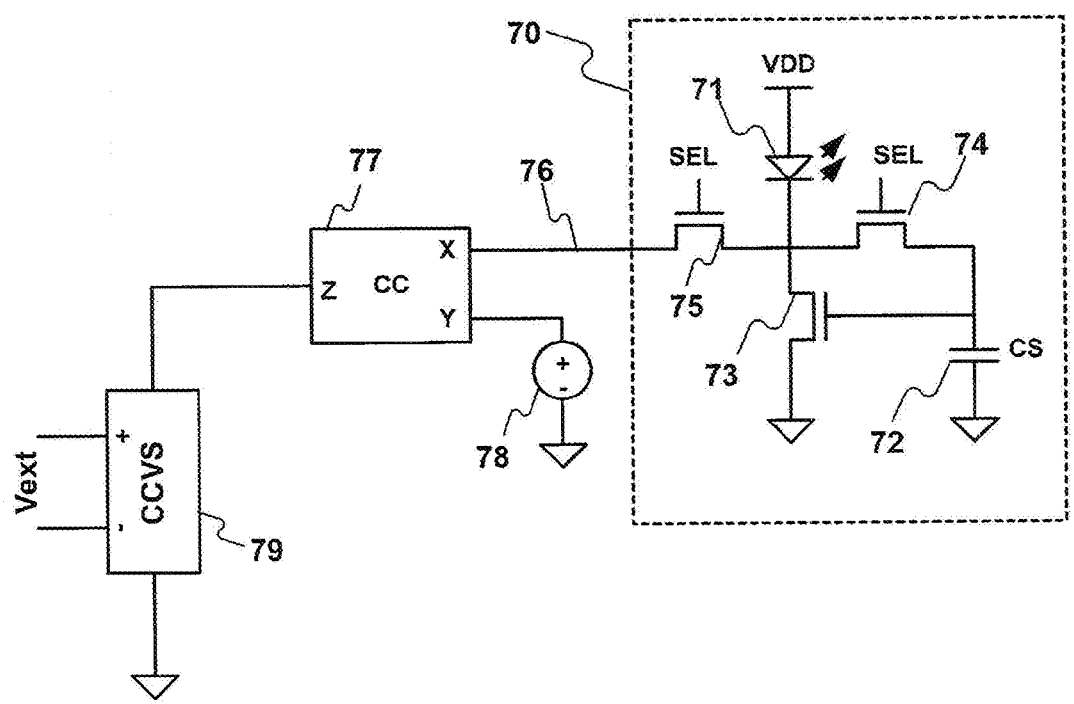
FIG. 4 is a diagram showing an example of the extracting, programming and driving system of FIG. 3 and a pixel circuit.

FIG. 4 illustrates an example of a system for the voltage-extracting, programming and driving of FIG. 3, which is employed with a top-emission current-cell pixel circuit 70. The pixel circuit 70 includes an OLED 71, a storage capacitor 72, a driving transistor 73 and switch transistors 74 and 75.

The transistors 73, 74 and 75 may be n-type TFTs. However, these transistors 73, 74 and 75 may be p-type transistors. The voltage-extracting and programming technique applied to the pixel circuit 70 is also applicable to a pixel circuit having p-type transistors.

The driving transistor 73 is connected to a data line 76 through the switch transistor 75, and is connected to the OLED 71, and also is connected to the storage capacitor 72 through the switch transistor 74. The gate terminal of the driving transistor 73 is connected to the storage capacitor 72. The gate terminals of the switch transistors 74 and 75 are connected to a select line SEL. The OLED 71 is connected to a voltage supply electrode or line VDD. The pixel circuit 70 is selected by the select line SEL and is driven by DATA on the data line 76.

A current conveyor (CC) 77 has X, Y and Z terminals, and is used to extract a current on the data line 76 without loading it. A voltage source 78 applies programming voltage to the Y terminal of the CC 77. In the CC 77, the X terminal is forced by feedback to have the same voltage as that of the Y terminal. Also, the current on the X terminal is duplicated into the Z terminal of the CC 77. A current-controlled voltage source (CCVS) 79 has a positive node and a negative node. The CCVS 79 converts the current on the Z terminal of the CC 77 into a voltage Vext.

Vext is provided to the display controller and scheduler 64 of FIG. 3, where the threshold voltage of the driving transistor 73 is extracted. The display controller and scheduler 64 controls the voltage source 78 based on the extracted threshold voltage.

Figure 5:
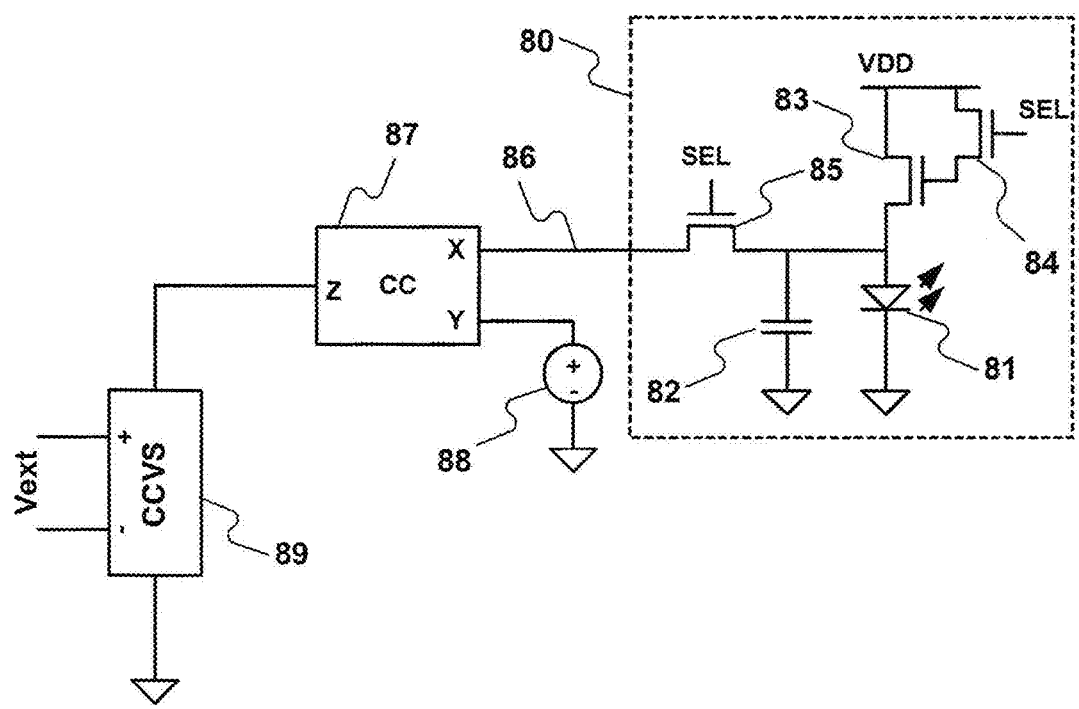
FIG. 5 is a diagram showing a further example of the extracting, programming and driving system of FIG. 3 and a pixel circuit.

FIG. 5 illustrates a further example of a system for the voltage-extracting, programming, and driving of FIG. 3, which is employed with a bottom-emission current-cell pixel circuit 80. The pixel circuit 80 includes an OLED 81, a storage capacitor 82, a driving transistor 83, and switch transistors 84 and 85. The transistors 83, 84 and 85 may be n-type TFTs. However, these transistors 83, 84 and 85 may be p-type transistors.

The driving transistor 83 is connected to a data line 86 through the switch transistor 85, and is connected to the OLED 81, and also is connected to the storage capacitor 82. The gate terminal of the driving transistor 83 is connected to a voltage supply line VDD through the switch transistor 84. The gate terminals of the switch transistors 84 and 85 are connected to a select line SEL. The pixel circuit 80 is selected by the select line SEL and is driven by DATA on the data line 86.

A current conveyor (CC) 87 has X, Y and Z terminals, and is used to extract a current on the data line 86 without loading it. A voltage source 88 applies a negative programming voltage at the Y terminal of the CC 87. In the CC 87, the X terminal is forced by feedback to have the same voltage as that of the Y terminal. Also, the current on the X terminal is duplicated into the Z terminal of the CC 87. A current-controlled voltage source (CCVS) 89 has a positive node and a negative node. The CCVS 89 converts the current of the Z terminal of the CC 87 into a voltage Vext.

Vext is provided to the display controller and scheduler 64 of FIG. 3, where the threshold voltage of the driving transistor 83 is extracted. The display controller and scheduler 64 controls the voltage source 88 based on the extracted threshold voltage.

Figure 6:
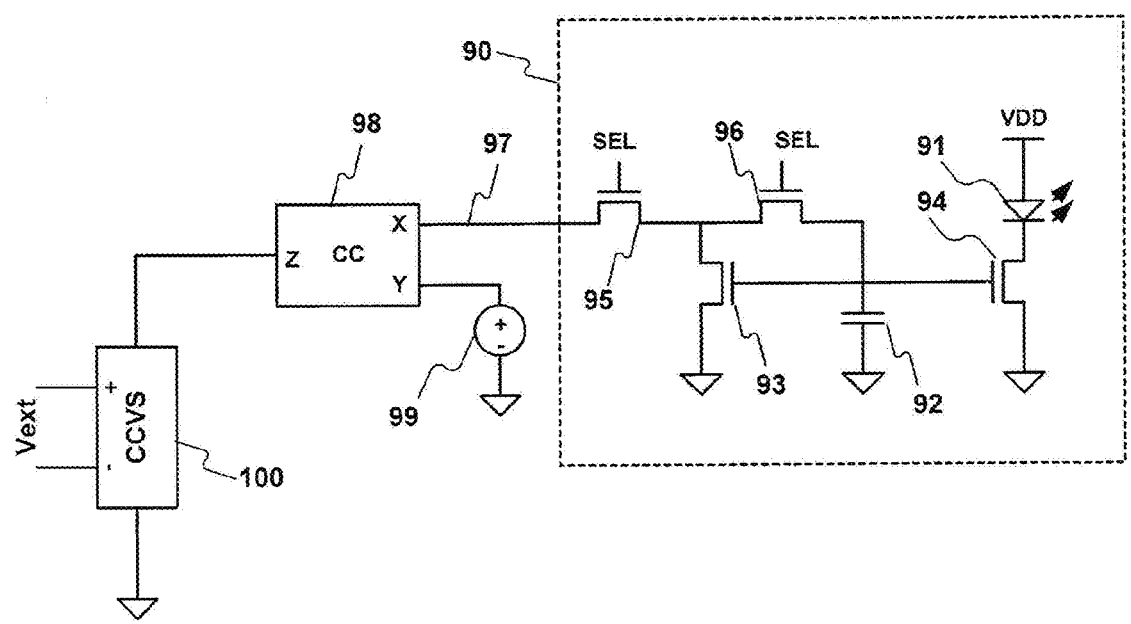
FIG. 6 is a diagram showing a further example of the extracting, programming and driving system of FIG. 3 and a pixel circuit.

FIG. 6 illustrates a further example of a system for the voltage-extracting, programming and driving of FIG. 3, which is employed with a top-emission current-mirror pixel circuit 90. The pixel circuit 90 includes an OLED 91, a storage capacitor 92, mirror transistors 93 and 94, and switch transistors 95 and 96. The transistors 93, 94, 95 and 96 maybe n-type TFTs. However, these transistors 93, 94, 95 and 96 may be p-type transistors.

The mirror transistor 93 is connected to a data line 97 through the switch transistor 95, and is connected to the storage capacitor 92 through the switch transistor 96. The gate terminals of the mirror transistors 93 and 94 are connected to the storage capacitor 92 and the switch transistor 96. The mirror transistor 94 is connected to a voltage supply electrode or line VDD through the OLED 91. The gate terminals of the switch transistors 85 and 86 are connected to a select line SEL. The pixel circuit 90 is selected by the select line SEL and is driven by DATA on the data line 97.

A current conveyor (CC) 98 has X, Y and Z terminals, and is used to extract the current of the data line 97 without loading it. A voltage source 99 applies a positive programming voltage at the Y terminal of the CC 98. In the CC 98, the X terminal is forced by feedback to have the same voltage as the voltage of the Y terminal. Also, the current on the X terminal is duplicated into the Z terminal of the CC 98. A current-controlled voltage source (CCVS) 100 has a positive node and a negative node. The CCVS 100 converts a current on the Z terminal of the CC 98 into a voltage Vext.

Vext is provided to the display controller and scheduler 64 of FIG. 3, where the threshold voltage of the driving transistor 93 is extracted. The display controller and scheduler 64 controls the voltage source 99 based on the extracted threshold voltage.

Figure 7:
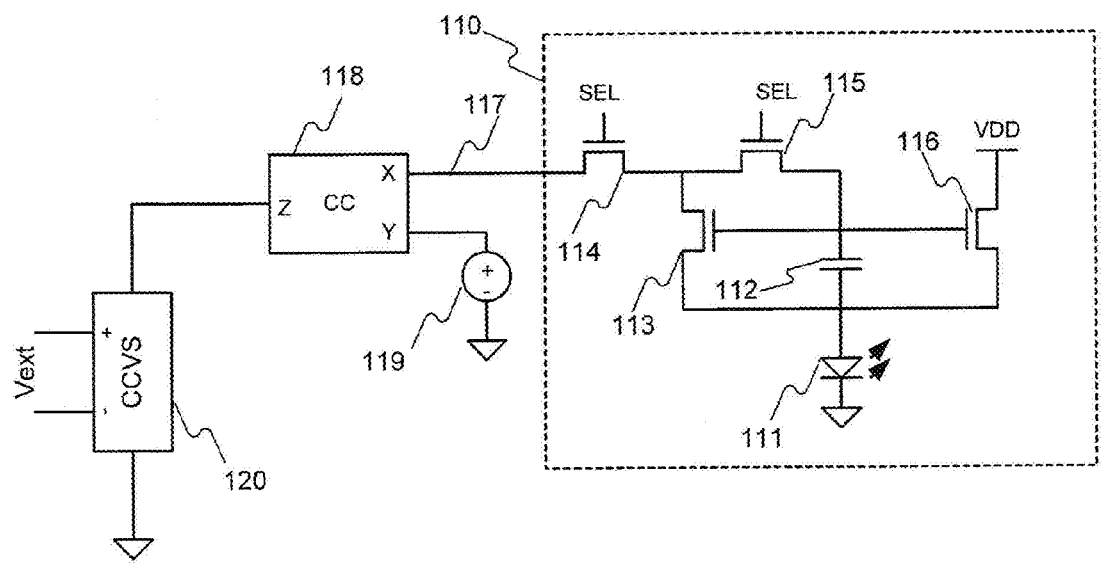
FIG. 7 is a diagram showing a further example of the extracting, programming and driving system of FIG. 3 and a pixel circuit.

FIG. 7 illustrates a further example of a system for the voltage-extracting, programming and driving of FIG. 3, which is employed with a bottom-emission current-mirror pixel circuit 110. The pixel circuit 110 includes an OLED 111, a storage capacitor 112, mirror transistors 113 and 116, and switch transistors 114 and 115. The transistors 113, 114, 115 and 116 may be n-type TFTs. However, these transistors 113, 114, 115 and 116 may be p-type transistors.

The mirror transistor 113 is connected to a data line 117 through the switch transistor 114, and is connected to the storage capacitor 112 through the switch transistor 115. The gate terminals of the mirror transistors 113 and 116 are connected to the storage capacitor 112 and the switch transistor 115. The mirror transistor 116 is connected to a voltage supply line VDD. The mirror transistors 113, 116 and the storage capacitor 112 are connected to the OLED 111. The gate terminals of the switch transistors 114 and 115 are connected to a select line SEL. The pixel circuit 110 is selected by the select line SEL and is driven by DATA on the data line 117.

A current conveyor (CC) 118 has X, Y and Z terminals, and is used to extract the current of the data line 117 without loading it. A voltage source 119 applies a positive programming voltage at the Y terminal of the CC 118. In the CC 118, the X terminal is forced by feedback to have the same voltage as the voltage of the Y terminal of the CC 118. Also, the current on the X terminal is duplicated into the Z terminal of the CC 118. A current-controlled voltage source (CCVS) 120 has a positive node and a negative node. The 120 converts the current on the Z terminal of the CC 118 into a voltage Vext.

Vext is provided to the display controller and scheduler 64 of FIG. 3, where the threshold voltage of the driving transistor 113 is extracted. The display controller and scheduler 64 controls the voltage source 119 based on the extracted threshold voltage.

Referring to FIGS. 3-7, using the voltage-extracting technique, time dependent parameters of a pixel (e.g. threshold shift) can be extracted. Thus, the programming voltage can be calibrated with the extracted information, resulting in a stable pixel current overtime. Since the voltage of the OLED (i.e. 71 of FIG. 4, 81 of FIG. 5, 91 of FIG. 6, 111 of FIG. 7) affects the current directly, the voltage-extracting driving technique described above can also be used to extract OLED degradation as well as the threshold shift.

The voltage-extracting technique described above can be used with any current-mode pixel circuit, including current-mirror and current-cell pixel circuit architectures, and are applicable to the display array 10 of FIG. 2. A stable current independent of pixel aging under prolonged display operation can be provided using the extracted information. Thus, the display operating lifetime is efficiently improved.

It is noted that the transistors in the pixel circuits of FIGS. 3-7 may be fabricated using amorphous silicon, nano/micro crystalline silicon, poly silicon, organic semiconductors technologies (e.g. organic TFT), NMOS/PMOS technology or CMOS technology (e.g. MOSFET). The pixel circuits of FIGS. 3-7 may form AMOLED display arrays.

A further technique for programming, extracting time dependent parameters of a pixel and driving the pixel is described in detail with reference to FIGS. 8-17. The technique includes a step-calibration driving technique. In the step-calibration driving technique, information on the aging of a pixel (e.g. threshold shift) is extracted. The extracted information will be used to generate a stable pixel current/luminance. Despite using the one-bit extraction technique, the resolution of the extracted aging is defined by display drivers. Also, the dynamic effects are compensated since the pixel aging is extracted under operating condition, which is similar to the driving cycle.

Figure 8:
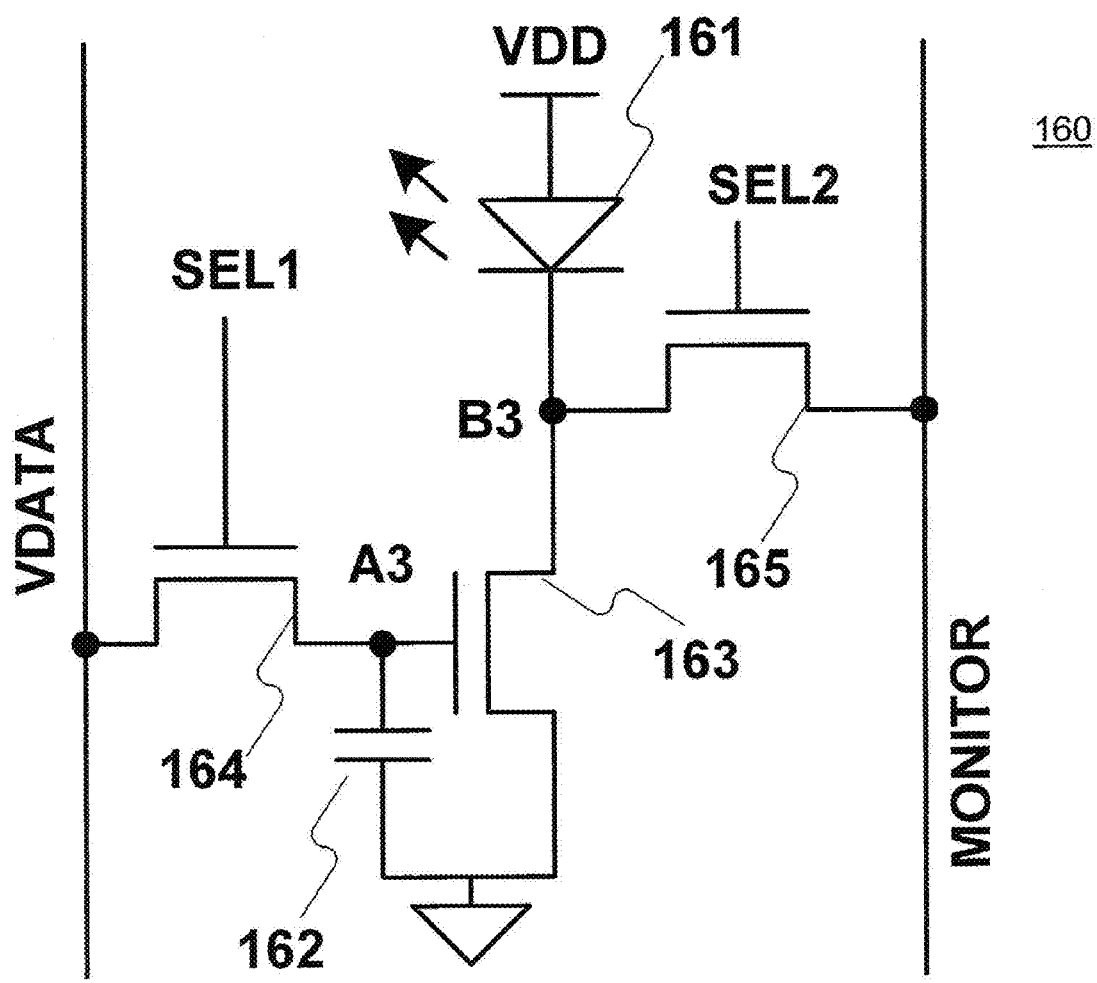
FIG. 8 is a diagram showing a pixel circuit to which a step-calibration driving in accordance with an embodiment of the present invention is applied.

FIG. 8 illustrates a pixel circuit 160 to which a step-calibration driving in accordance with an embodiment of the present invention is applied. The pixel circuit 160 includes an OLED 161, a storage capacitor 162, and a driving transistor 163 and switch transistors 164 and 165. The pixel circuit 160 is a current-programmed, 3-TFT pixel circuit. A plurality of the pixel circuits 160 may form an AMOLED display.

The transistors 163, 164 and 165 are n-type TFTs. However, the transistors 163, 164 and 165 may be p-type TFTs. The step-calibration driving technique applied to the pixel circuit 160 is also applicable to a pixel circuit having p-type transistors. The transistors 163, 164 and 165 maybe fabricated using amorphous silicon, nano/micro crystalline silicon, poly silicon, organic semiconductors technologies (e.g. organic TFT), NMOS/PMOS technology or CMOS technology (e.g. MOSFET).

The gate terminal of the driving transistor 163 is connected to a signal line VDATA through the switch transistor 164, and also connected to the storage capacitor 162. The source terminal of the driving transistor 163 is connected to a common ground. The drain terminal of the driving transistor 163 is connected to a monitor line MONITOR through the switch transistor 165, and also is connected to the cathode electrode of the OLED 161.

The gate terminal of the switch transistor 164 is connected to a select line SEL1. The source terminal of the switch transistor 164 is connected to the gate terminal of the driving transistor 163, and is connected to the storage capacitor 162. The drain terminal of the switch transistor 164 is connected to VDATA.

The gate terminal of the switch transistor 165 is connected to a select line SEL2. The source terminal of the switch transistor 165 is connected to MONITOR. The drain terminal of the switch transistor 165 is connected to the drain terminal of the driving transistor 163 and the cathode electrode of the OLED 161. The anode electrode of the OLED 161 is connected to a voltage supply electrode or line VDD.

The transistors 163 and 164 and the storage capacitor 162 are connected at node A3. The transistors 163 and 165 and the OLED 161 are connected at node B3.

Figure 9:
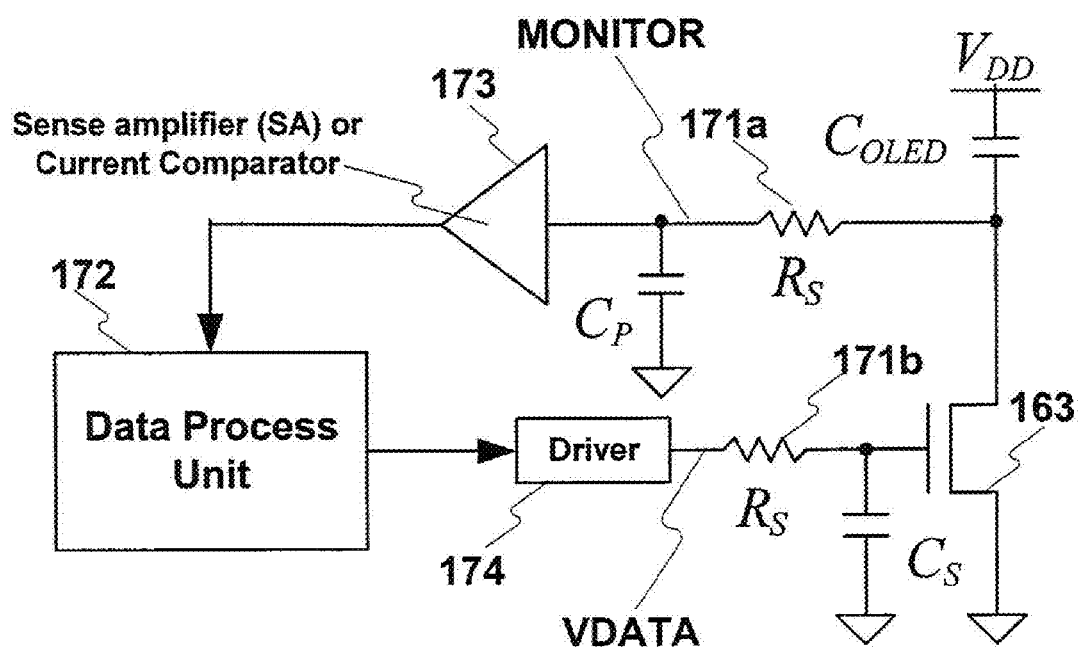
FIG. 9 is a diagram showing an example of a driver and extraction block and the driving transistor of FIG. 8.

FIG. 9 illustrates an example of a driver and extraction block 170 along with the driving transistor 163 of FIG. 8. In FIG. 9, each of Rs 171*a* and Rs 171*b* represents the ON resistance of the switch transistors (e.g. 164, 165 of FIG. 8). Cs represents the storage capacitor of the pixel, COLED represents the OLED capacitance, and CP represents the line parasitic capacitance. In FIG. 9, the OLED is presented as a capacitance.

A block 173 is used to extract the threshold voltage of the driving transistor, during the extraction cycle. The block 173 may be a current sense amplifier (SA) or a current comparator. In the description, the block 173 is referred to as "SA block 173".

If the current of the MONITOR line is higher than a reference current (IREF), the output of the SA block 173 (i.e. Triggers of FIG. 10, 11) becomes one. If the current of the MONITOR line is less than the reference current (IREF), the output of the SA block 173 becomes zero.

It is noted that the SA block 173 can be shared between few columns result in less overhead. Also, the calibration of the pixel circuit can be done one at a time, so the extraction circuits can be shared between the all columns.

A data process unit (DPU) block 172 is provided to control the programming cycle, contrast, and brightness, to perform the calibration procedure and to control the driving cycle. The DPU block 172 implements extraction algorithm to extract (estimate) the threshold voltage of the driving transistor based on the output from the SA block 173, and controls a driver 174 which is connected to the driving transistor 163.

Figure 10:
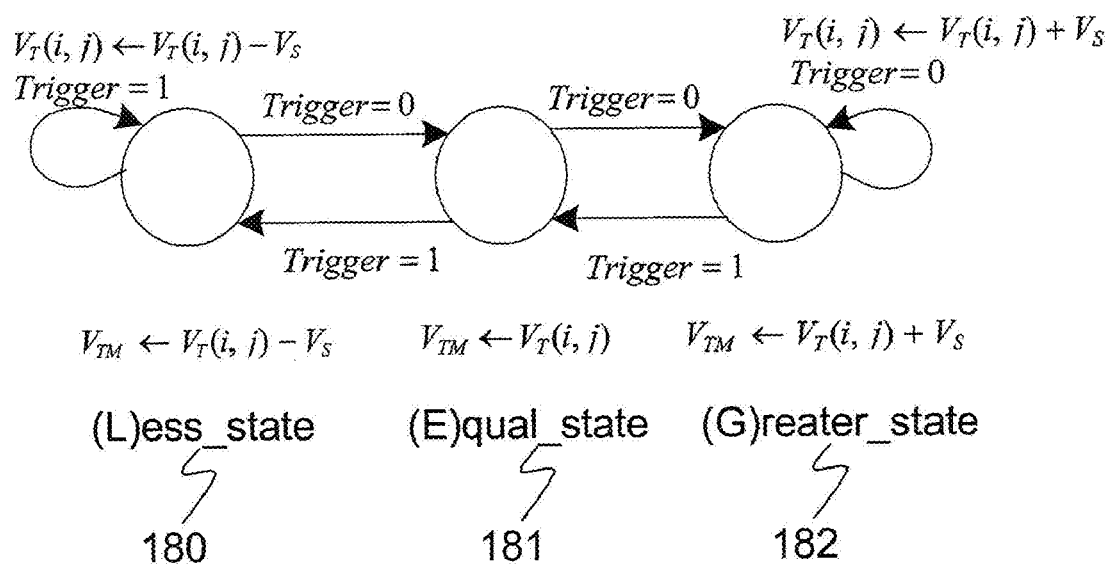
FIG. 10 is a diagram showing an example of an extraction algorithm implemented by a DPU block of FIG. 9.

FIG. 10 illustrates an example of the extraction algorithm implemented by the DPU block 172 of FIG. 9. The algorithm of FIG. 10 is in a part of the DPU block 172. In FIG. 10, $V_T(i,j)$ represents the extracted threshold voltage for the pixel (i,j) at the previous extraction cycle, Vs represents the resolution of the driver 174, "i" represents a row of a pixel array and "j" represents a column of a pixel array. Trigger conveys the comparison results of the SA block 173 of FIG. 9. Less_state 180 determines the situation in which the actual $V_T$ of the pixel is less than the predicted $V_T$ ($V_{TM}$), Equal_state 181 determines the situation in which the predicted $V_T$ ($V_{TM}$) and the actual $V_T$ of the pixel are equal, and Great_state 182 determines the situation in which the actual $V_T$ of the pixel is greater than the predicted $V_T$ ($V_{TM}$).

Figure 16:
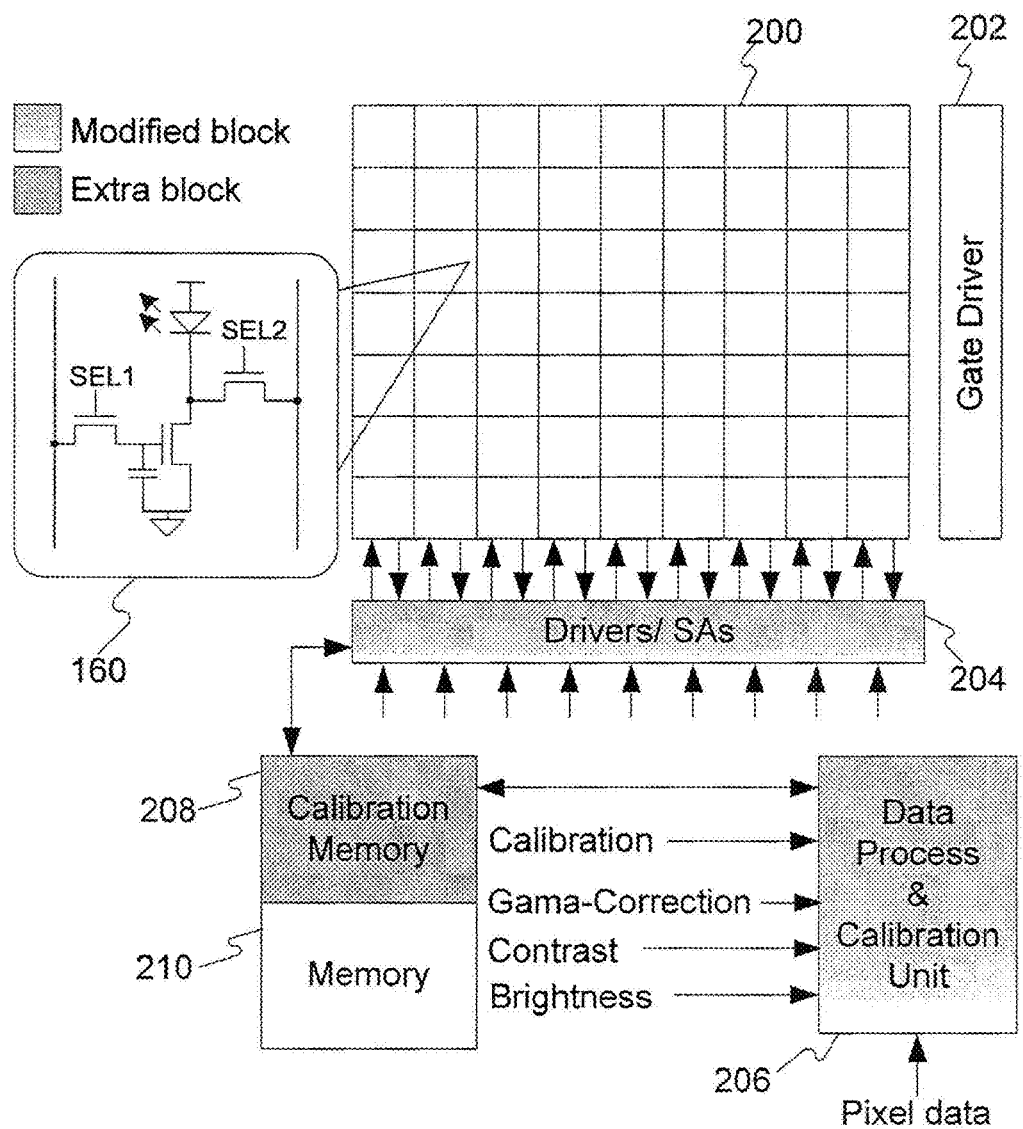
FIG. 16 is a diagram showing an example of a system architecture for the step-calibration driving with a display array.

The DPU block 172 of FIG. 9 determines an intermediate threshold voltage $V_{TM}$ as follows:

(A1) When s(i,j)=Less_state (180), the actual threshold voltage is less than $V_T(i,j)$, $V_{TM}$ is set to ($V_T(i,j)-V_S$).
(A2) When s(i,j)=Equal_state (181), the actual threshold voltage is equal to $V_T(i,j)$, $V_{TM}$ is set to $V_T(i,j)$.
(A3) When s(i,j)=Greater_state (182), the actual threshold voltage is greater than $V_T(i,j)$, $V_{TM}$ is set to ($V_T(i,j)+V_S$).

where s(i,j) represents the previous state of the pixel (i,j) stored in a calibration memory (e.g. 208 of FIG. 16).

Figure 11:
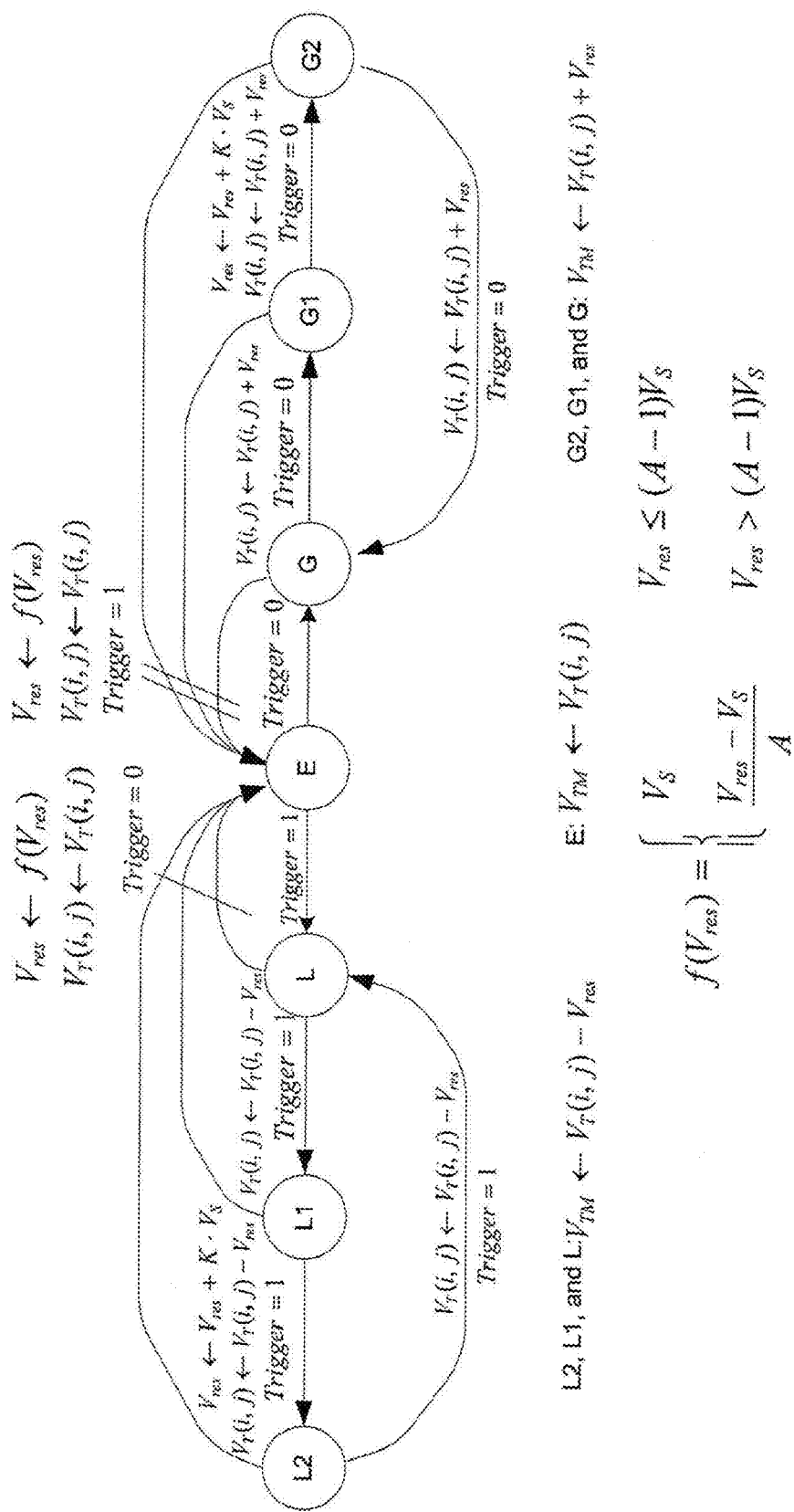
FIG. 11 is a diagram showing a further example of the extraction algorithm implemented by the DPU block of FIG. 9.

FIG. 11 illustrates a further example of the extraction algorithm implemented by the DPU block 172 of FIG. 9. The algorithm of FIG. 11 is in a part of the DPU block 172 of FIG. 9. In FIG. 11, $V_T(i,j)$ represents the extracted threshold voltage for the pixel (i,j) at the previous extraction cycle, $V_S$ represents the resolution of the driver 174, "i" represents a row of a pixel array and "j" represents a column of a pixel array. Trigger conveys the comparison results of the SA block 173.

Further, in FIG. 11, Vres represents the step that will be added/subtracted to the predicted $V_T$ ($V_{TM}$) in order achieve the actual $V_T$ of the pixel, A represents the reduction gain of a prediction step, and K represents the increase gain of the prediction step.

The operation of FIG. 11 is the same as that of FIG. 10, except that it has gain extra states L2 and G2 for rapid extraction of abrupt changes. In the gain states, the step size is increased to follow the changes more rapidly. L1 and G1 are the transition states which define the $V_T$ change is abrupt or normal.

Figure 12:
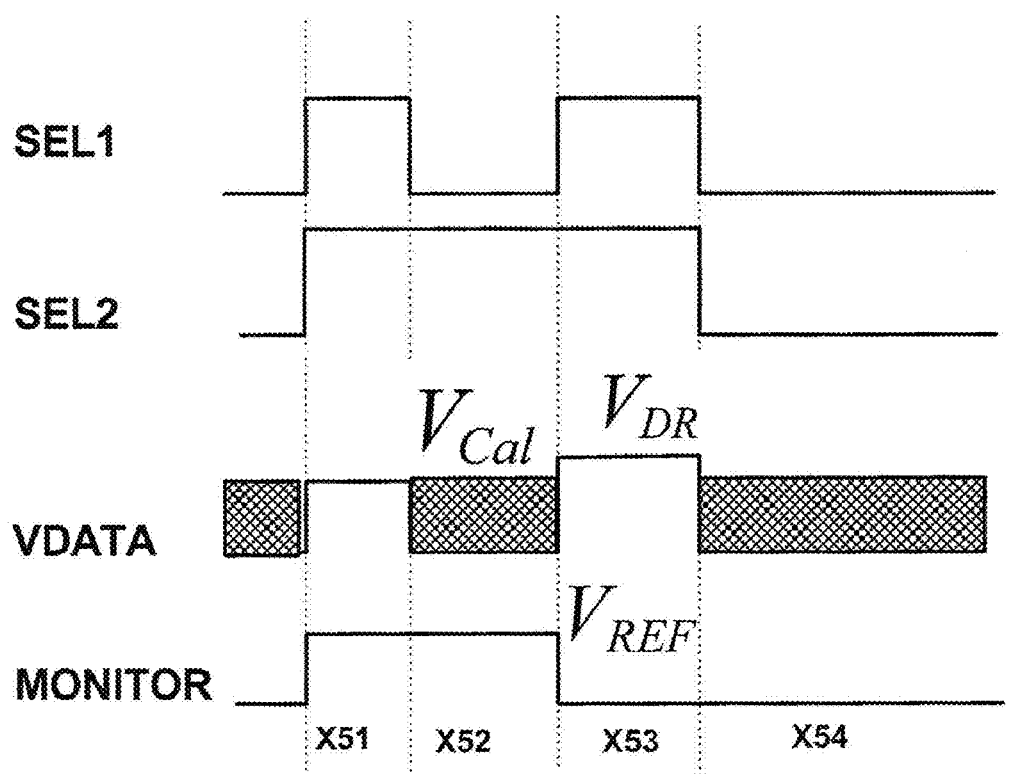
FIG. 12 is a timing diagram showing an example of waveforms for the step-calibration driving.

FIG. 12 illustrates an example of waveforms applied to the pixel circuit 160 of FIG. 8. In FIG. 12, $V_{Call}=V_B+V_{TM}$, and $V_{DR}=V_P+V_T(i,j)+V_{REF}$, where $V_B$ represents the bias voltage during the extraction cycle, $V_{TM}$ is defined based on the algorithm shown in FIG. 10 or 11, $V_P$ represents a programming voltage, $V_T(i,j)$ represents the extracted threshold voltage at the previous extraction cycle, $V_{REF}$ represents the source voltage of the driving transistor during the programming cycle.

Referring to FIGS. 8-12, the operation of the pixel circuit 160 includes operating cycles X51, X52, X53, and X54. In FIG. 12, an extraction cycle is separated from a programming cycle. The extraction cycle includes X51 and X52, and the programming cycle includes X53. X54 is a driving cycle. At the end of the programming cycle, node A3 is charged to ($V_P+V_T$) where $V_P$ is a programming voltage and $V_T$ is the threshold voltage of the driving transistor 163.

In the first operating cycle X51: SEL1 and SEL 2 are high. Node A3 is charged to $V_{cal}$, and node B3 is charged to $V_{REF}$. $V_{cal}$ is $V_B+V_{TM}$ in which $V_B$ is a bias voltage, and $V_{TM}$ the predicted $V_T$, and $V_{REF}$ should be larger than $V_{DD}-V_{OLED0}$ where $V_{OLED0}$ is the ON voltage of the OLED 161.

In the second operating cycle X52: SEL1 goes to zero. The gate-source voltage of the driving transistor 163 is given by:

$$VGS=V_B+V_{TM}+\Delta V_B+\Delta V_{TM}-\Delta V_{T2}-\Delta V_H$$

where VGS represents the gate-source voltage of the driving transistor 163, $\Delta V_B$, $\Delta V_{TM}$, $\Delta VT2$ and $\Delta V_H$ are the dynamic effects depending on $V_B$, $V_{TM}$, $V_{T2}$ and $V_H$, respectively. $V_{T2}$ represents the threshold voltage of the switch transistor 164, and $V_H$ represents the change in the voltage of SEL1 at the beginning of second operating cycle X52 when it goes to zero.

The SA block 173 is tuned to sense the current larger than $\beta(V_B)^2$, so that the gate-source voltage of the driving transistor 163 is larger than ($V_B+V_T$), where $\beta$ is the gain parameter in the I-V characteristic of the driving transistor 163.

As a result, after few iterations, $V_{TM}$ and the extracted threshold voltage $V_T(i,j)$ for the pixel (i,j) converge to:

$$V_{TM} = V_T - \gamma \cdot (V_B + V_T + V_{T2} - V_H)$$

$$\gamma = \frac{C_{g2}/(2 \cdot C_S)}{1+C_{g2}/(2 \cdot C_S)}$$

where $C_{g2}$ represents the gate capacitance of the switch transistor 164.

In the third operating cycle X53: SEL1 is high. VDATA goes to $V_{DR}$. Node A3 is charged to $[V_P+V_T(i,j)-\gamma(V_P-V_B)]$.

In the fourth operating cycle X54: SEL1 and SEL2 go to zero. Considering the dynamic effects, the gate-source voltage of the driving transistor 163 can be written as:

$$VGS = V_P + V_T$$

Therefore, the pixel current becomes independent of the static and dynamic effects of the threshold voltage shift.

Figure 13:
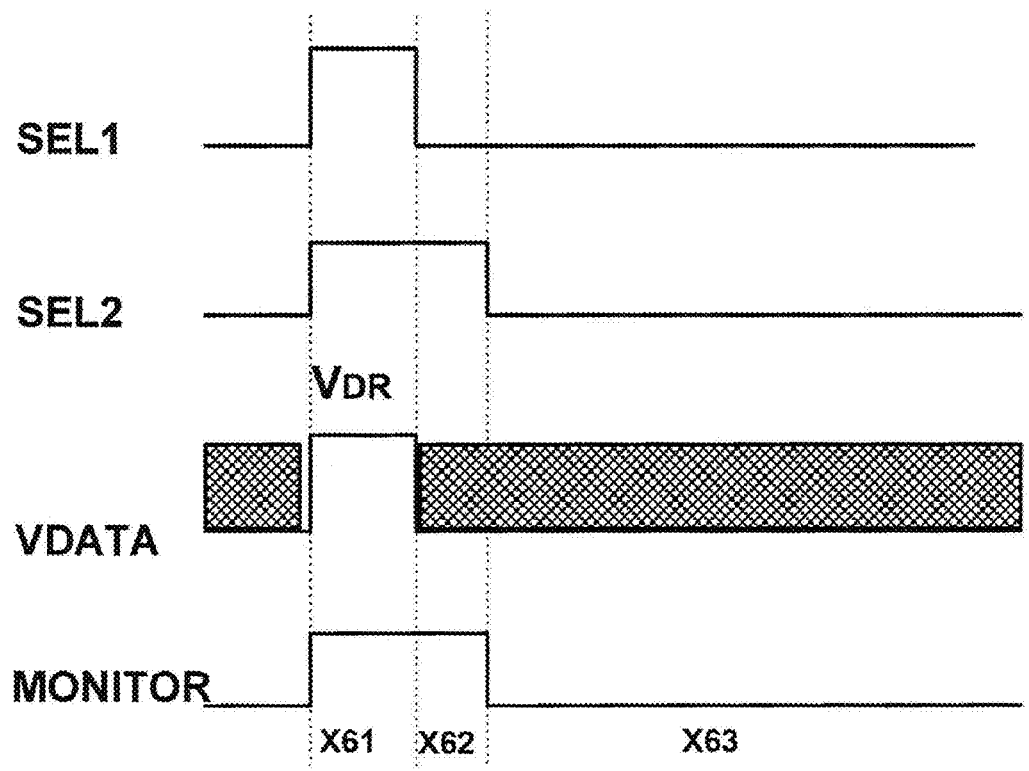
FIG. 13 is a timing diagram showing a further example of waveforms for the step-calibration driving.

In FIG. 12, the extraction cycle and the programming cycle are shown as separated cycles. However, the extraction cycle and the programming cycle may be merged as shown in FIG. 13. FIG. 13 illustrates a further example of waveforms applied to the pixel circuit 160 of FIG. 8.

Referring to FIGS. 8-11 and 13, the operation of the pixel circuit 160 includes operating cycles X61, X62 and X63. Programming and extraction cycles are merged into the operating cycles X61 and X62. The operating cycle X63 is a driving cycle.

During the programming cycle, the pixel current is compared with the desired current, and the threshold voltage of the driving transistor is extracted with the algorithm of FIG. 10 or 11. The pixel circuit 160 is programmed with $V_{DR}=V_P+V_T(i,j)+V_{REF}$ during the operating cycle X61. Then the pixel current is monitored through the MONITOR line, and is compared with the desired current. Based on the comparison result and using the extraction algorithm of FIGS. 10 or 11, the threshold voltage $V_T(i,j)$ is updated.

In FIG. 8, two select lines SEL1 and SEL2 are shown. However, a signal select line (e.g. SEL1) can be used as a common select line to operate the switch transistors 164 and 165. When using the common select line, SEL1 of FIG. 12 stays at high in the second operating cycle X52, and the VGS remains at $(V_B+V_{TM})$. Therefore, the dynamic effects are not detected.

Figure 14:
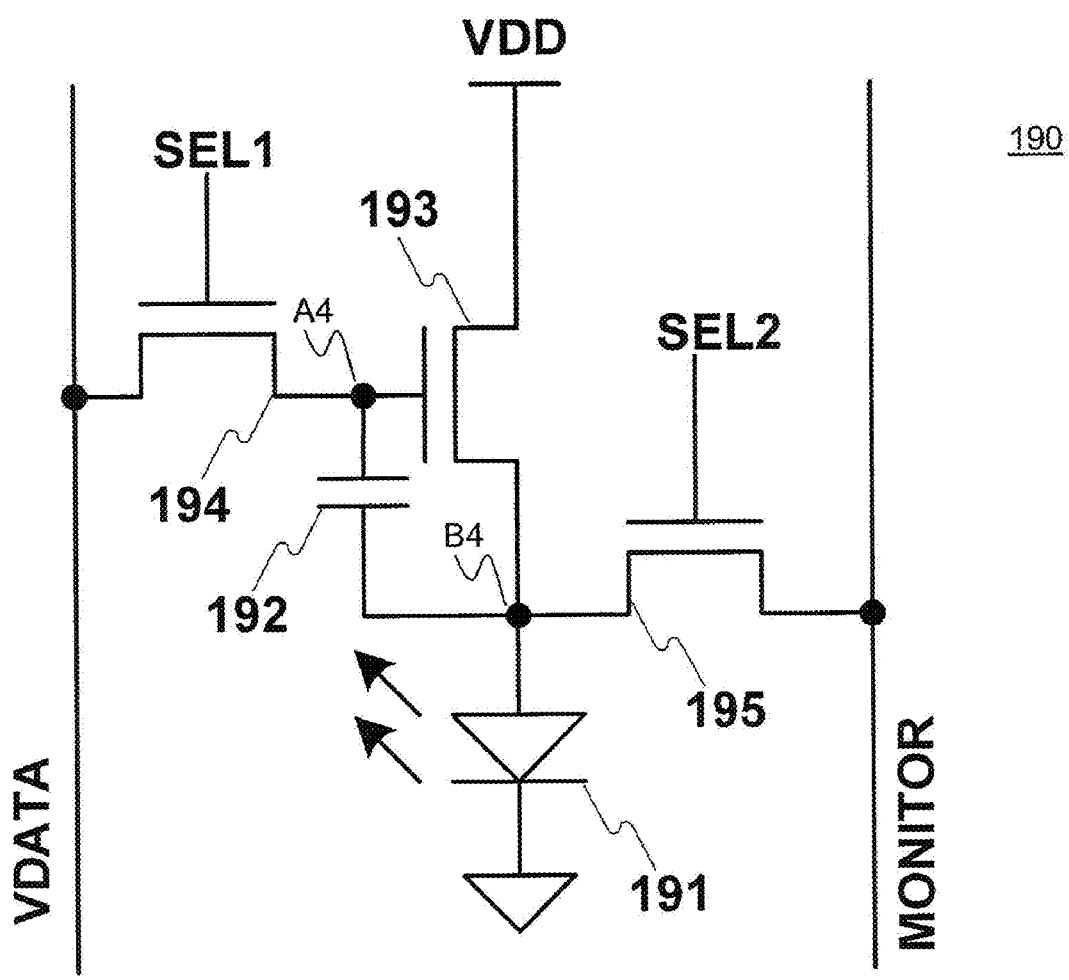
FIG. 14 is a diagram showing a pixel circuit to which the step-calibration driving is applicable.

The step-calibration driving technique described above is applicable to the pixel circuit 190 of FIG. 14. The pixel circuit 190 includes an OLED 191, a storage capacitor 192, and a driving transistor 193 and switch transistors 194 and 195. The pixel circuit 190 is a current-programmed, 3-TFT pixel circuit. A plurality of the pixel circuits 190 may form an AMOLED display.

The transistors 193, 194 and 195 are n-type TFTs. However, the transistors 193, 194 and 195 may be p-type TFTs. The step-calibration driving technique applied to the pixel circuit 190 is also applicable to a pixel circuit having p-type transistors. The transistors 193, 194 and 195 maybe fabricated using amorphous silicon, nano/micro crystalline silicon, poly silicon, organic semiconductors technologies (e.g. organic TFT), NMOS/PMOS technology or CMOS technology (e.g. MOSFET).

The gate terminal of the driving transistor 193 is connected to a signal line VDATA through the switch transistor 194, and also connected to the storage capacitor 192. The source terminal of the driving transistor 193 is connected to the anode electrode of the OLED 191, and is connected to a monitor line MONITOR through the switch transistor 195. The drain terminal of the driving transistor 193 is connected to a voltage supply line VDD. The gate terminals of the transistors 194 and 195 are connected to select lines SEL1 and SEL2, respectively.

The transistors 193 and 194 and the storage capacitor 192 are connected at node A4. The transistor 195, the OLED 191 and the storage capacitor 192 are connected at node B4.

The structure of the pixel circuit 190 is similar to that of FIG. 8, except that the OLED 191 is at the source terminal of the driving transistor 193. The operation of the pixel circuit 190 is the same as that of FIG. 12 or 13.

Since the source terminal of the drive TFT 193 is forced to VREF during the extraction cycle (X51 and X52 or X62), the extracted data is independent of the ground bouncing. Also, during the programming cycle (X53 or X61), the source terminal of the drive TFT is forced to VREF, the gate-source voltage of the drive TFT becomes independent of the ground bouncing. As a result of these conditions, the pixel current is independent of ground bouncing.

Figure 15:
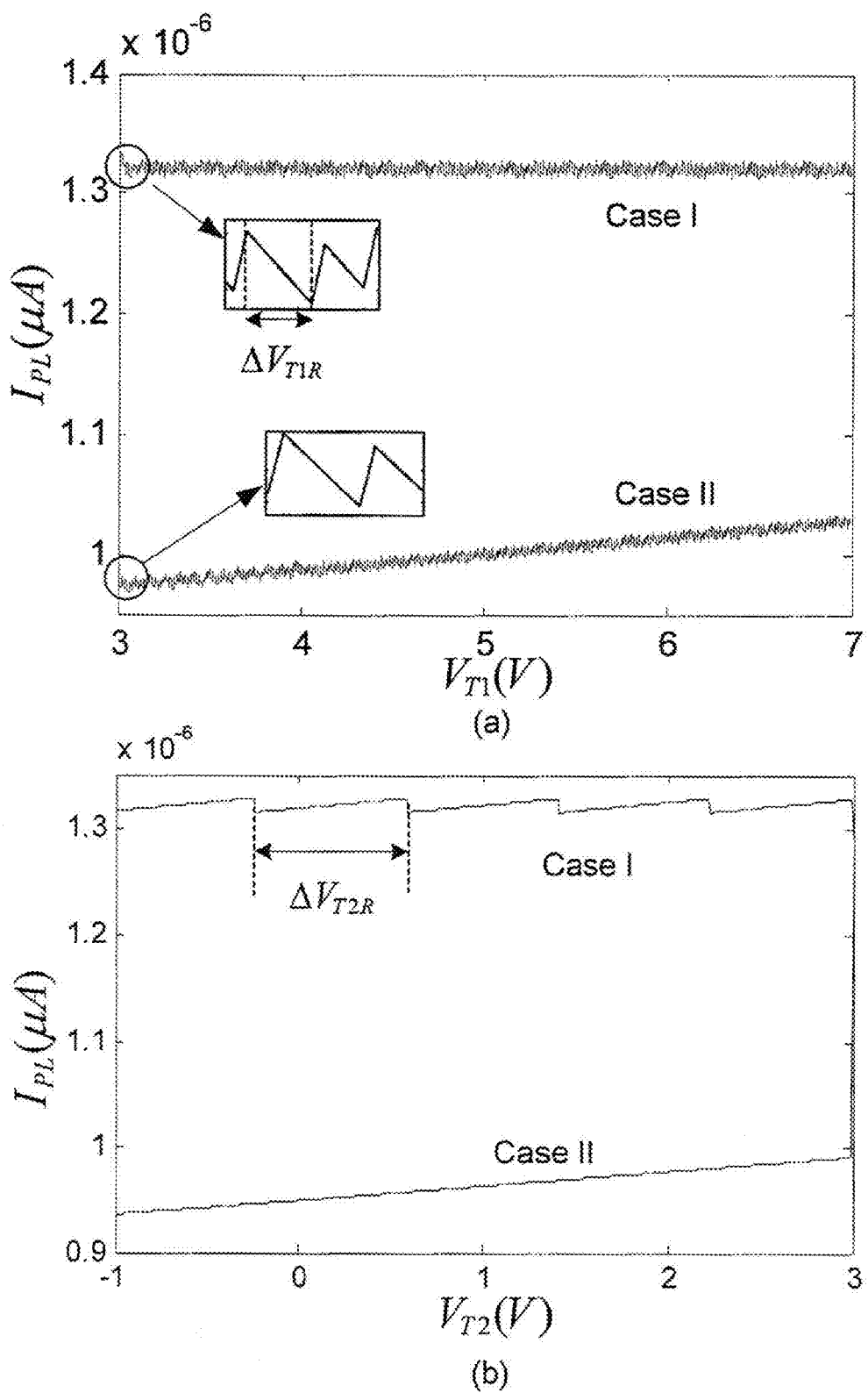
FIG. 15 is a graph showing the results of simulation for the step-calibration driving.

FIG. 15 illustrates the results of simulation for the step-calibration driving technique. In FIG. 15, "Case I" represents an operation of FIG. 8 where SEL1 goes to zero in the second operating cycle (X52 of FIG. 12); "Case II" represents an operation of FIG. 8 where SEL1 stays at high in the second operating cycle.

In FIG. 15, $\Delta V_{TR}$ is the minimum detectable shift in the threshold voltage of the driving transistor (e.g. 163 of FIG. 8), $\Delta V_{T2R}$ is the minimum detectable shift in the threshold voltage of the switch transistor (e.g. 164 of FIG. 8), and $I_{PL}$ is the pixel current of the pixel during the driving cycle.

The pixel current of Case II is smaller than that of Case I for a given programming voltage due to the dynamic effects of the threshold voltage shift. Also, the pixel current of Case II increases as the threshold voltage of the driving transistor increases (a), and decreases as the threshold voltage of the switch transistor decreases (b). However, the pixel current of Case I is stable. The maximum error induced in the pixel current is less than %0.5 for any shift in the threshold voltage of the driving and switch TFTs. It is obvious that $\Delta V_{T2R}$ is larger than $\Delta V_{TR}$ because the effect of a shift in $V_T$ on the pixel current is dominant. These two parameters are controlled by the resolution $(V_S)$ of the driver (e.g. 174 of FIG. 9), and the SNR of the SA block (e.g. 193 of FIG. 9). Since a shift smaller than $\Delta V_{TR}$ cannot be detected, and also the time constant of threshold-shift is large, the extraction cycles (e.g. X51, X52 of FIG. 12) can be done after a long time interval consisting of several frames, leading to lower power consumption. Also, the major operating cycles become the other programming cycle (e.g. X53 of FIG. 12) and the driving cycle (e.g. X54 of FIG. 12). As a result, the programming time reduces significantly, providing for high-resolution, large-area AMOLED displays where a high-speed programming is prerequisite.

FIG. 16 illustrates an example of a system architecture for the step-calibration driving with a display array 200. The display array 200 includes a plurality of the pixel circuits (e.g. 160 of FIG. 8 or 190 of FIG. 14).

A gate driver 202 for selecting the pixel circuits, a drivers/SAs block 204, and a data process and calibration unit block 206 are provided to the display array 200. The drivers/SAs block 204 includes the driver 174 and the SA block 173 of FIG. 9. The data process and calibration unit block 206 includes the DPU block 172 of FIG. 9. "Calibration" in FIG. 16 includes the calibration data from a calibration memory 208, and may include some user defined constants for setting up calibration data processing. The contrast and the brightness inputs are used to adjust the contrast and the brightness of the panel by the user. Also, gamma-correction data is defined based on the OLED characteristic and human eye. The gamma-correction input is used to adjust the pixel luminance for human eyes.

The calibration memory 208 stores the extracted threshold voltage $V_T(i,j)$ and the state $s(i,j)$ of each pixel. A memory 210 stores the other required data for the normal operation of a display including gamma correction, resolution, contrast, and etc. The DPU block performs the normal tasks assigned to a controller and scheduler in a display. Besides, the algorithm of FIG. 10 or 11 is added to it to perform the calibration.

Figure 17:
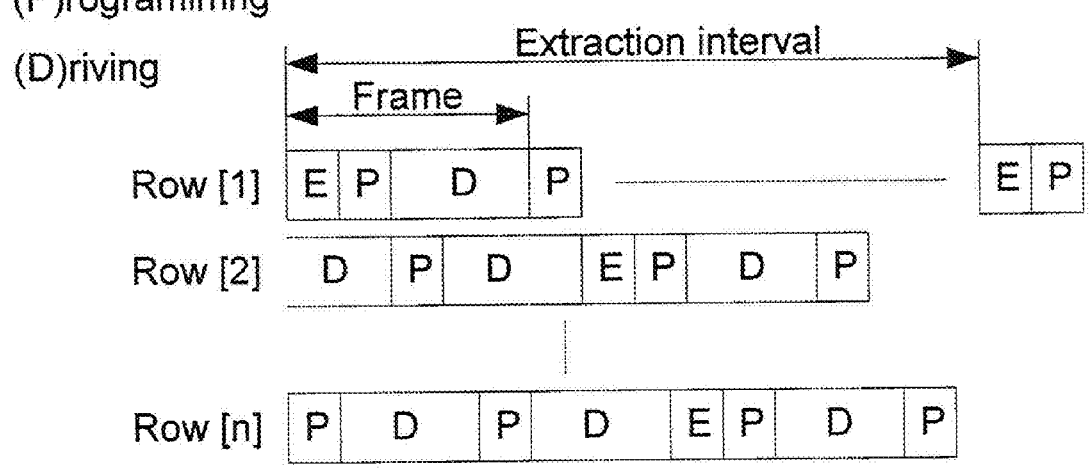
FIG. 17 is a timing diagram showing an example of waveforms applied to the system architecture of FIG. 16.

FIG. 17 illustrates an example of waveforms applied to the system architecture of FIG. 16. In FIG. 17, each of ROW[1], ROW[2], and ROW[3] represents a row of the display array 200, "E" represents an extraction operation, "P" represents a programming operation and "D" represents a driving operation. It is noted that the extraction cycles (E) are not required to be done for all the frame cycle. Therefore, after a long time interval (extraction interval), the extraction is repeated for a pixel.

As shown in FIG. 17, only one extraction procedure occurs during a frame time. Also, the VT extraction of the pixel circuits at the same row is preformed at the same time.

Therefore, the maximum time required to refresh a frame is:

$$\tau_F = n \cdot \tau_P + \tau_E$$

where $\tau_F$ represents the frame time, $\tau_P$ represents the time required to write the pixel data into the storage capacitor (e.g. 162 of FIG. 8), $\tau_E$ represents the extraction time, and n represents the number of row in the display array (e.g. 200 of FIG. 16).

Assuming $\tau E = m \cdot \tau_P$, the frame time $\tau_F$ can be written as:

$$\tau_F = (n+m) \cdot \tau_P$$

where m represents the timing required for the extraction cycles in the scale of programming cycle timing ($\tau_P$).

For example, for a Quarter Video Graphics Array (QVGA) display (240×320) with frame rate of 60 Hz, if m=10, the programming time of each row is 66 µs, and the extraction time is 0.66 ms.

It is noted that the step-calibration driving technique described above is applicable to any current-programmed pixel circuit other than those of FIGS. 8 and 14.

Using the step-calibration driving technique, the time dependent parameter(s) of a pixel, such as threshold shift, is extracted. Then, the programming-voltage is calibrated with the extracted information, resulting in a stable pixel current over time. Further, a stable current independent of the pixel aging under prolonged display operation can be is provided to the pixel circuit, which efficiently improves the display operating lifetime.

A technique for programming, extracting time dependent parameters of a pixel and driving the pixel in accordance with a further embodiment of the present invention is described in detail. The technique includes extracting information on the aging of a pixel (e.g. OLED luminance) by monitoring OLED voltage or OLED current, and generating luminance. The programming voltage is calibrated with the extracted information, resulting in stable brightness over time.

Since the OLED voltage/current has been reported to be correlated with the brightness degradation in the OLED (e.g. 161 of FIG. 8, 191 of FIG. 14), the programming voltage can be modified by the OLED voltage/current to provide a constant brightness.

For example, during the driving cycle, the voltage/current of the OLED (161 of FIG. 8 or 191 of FIG. 14) is extracted while SEL2 is high. Since the OLED voltage or current has been reported to be correlated with the brightness degradation in the OLED, the programming voltage can be modified by the OLED voltage to provide a constant brightness.

Figure 18:
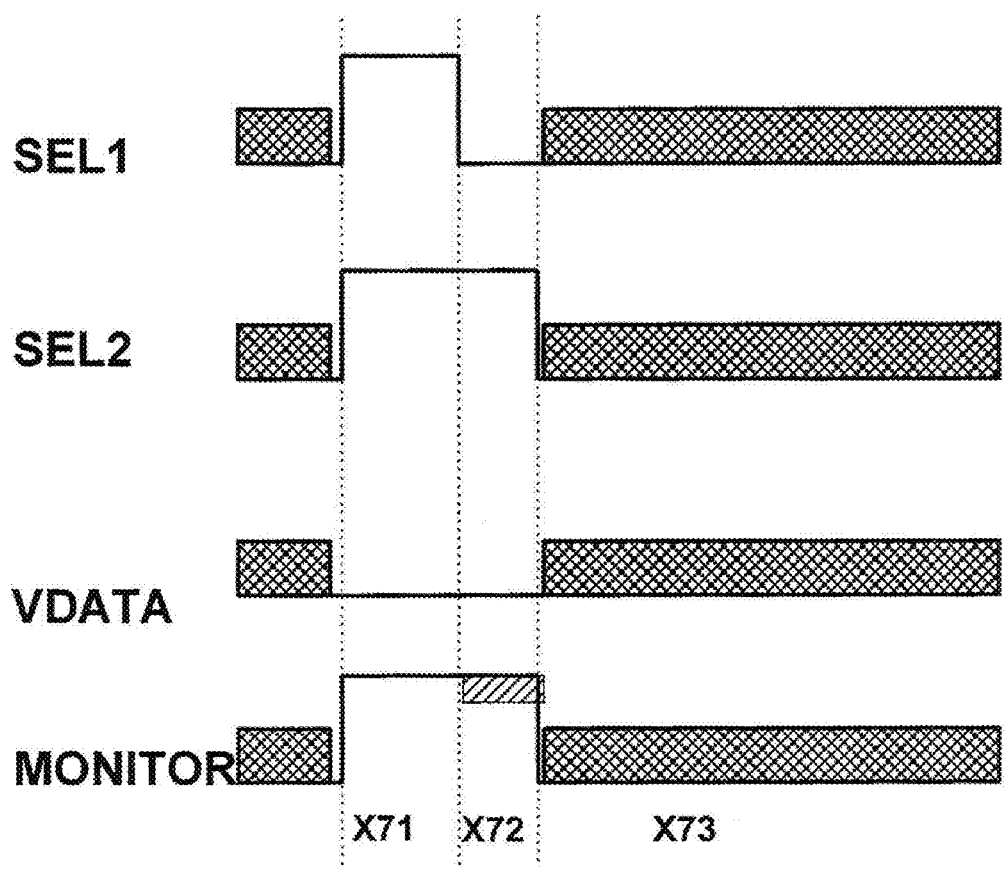
FIG. 18 is a timing diagram showing an example of waveforms for a voltage/current extraction.

FIG. 18 illustrates an example of waveforms for the voltage/current extraction. The waveforms of FIG. 18 are applicable to the pixel circuit 160 of FIG. 8 and the pixel circuit 190 of FIG. 14 to extract OLED voltage/current. The operation of FIG. 18 includes operating cycles X71, X72 and X73. The operating cycles X71 and X72 are an OLED extraction cycle. The operating cycle X73 is one of the operating cycles shown in FIGS. 12 and 13.

During the first operating cycle X71, SEL1 and SEL2 are high, and VDATA is zero. The gate-source voltage of the driving transistor (e.g. 163 of FIG. 8) becomes zero. A current or voltage is applied to the OLED (161 of FIG. 8) through the MONITOR line.

During the second operating cycle X72, SEL2 is high and SEL1 is low. The OLED voltage or current is extracted through the MONITOR line using the algorithm presented in FIGS. 10 or 11. This waveform can be combined with any other driving waveform.

In the above description, the algorithm of FIGS. 10 and 11 is used to predict the aging data, i.e. $V_T$ shift, based on the comparison results (current with current or voltage with voltage). However, the algorithm of FIGS. 10 and 11 is applicable to predict the shift in the OLED voltage $V_{OLED}$ by replacing $V_T$ with the $V_{OLED}$ and the comparison result of OLED current/voltage with a reference current/voltage. In the description above, the system architecture shown in FIG. 9 is used to compensate for the threshold shift. However, it is understood that the OLED data is also extracted when the architecture of FIG. 9, i.e. DPU 172, block 173, driver 174, is used. This data can be used to compensate for the OLED shift.

The operating cycle X73 can be any operating cycle including the programming cycle. This depends on the status of the panel after OLED extraction. If it is during the operation, then X73 is the programming cycle of the waveforms in FIGS. 12 and 13. The OLED voltage can be extracted during the driving cycle X55/X63 of FIG. 12/13. During the driving cycle X55/X63, the SEL2 of FIG. 8 or 14 goes to a high voltage, and so the voltage of the OLED can be read back through the MONITOR for a specific pixel current.

Figure 19:
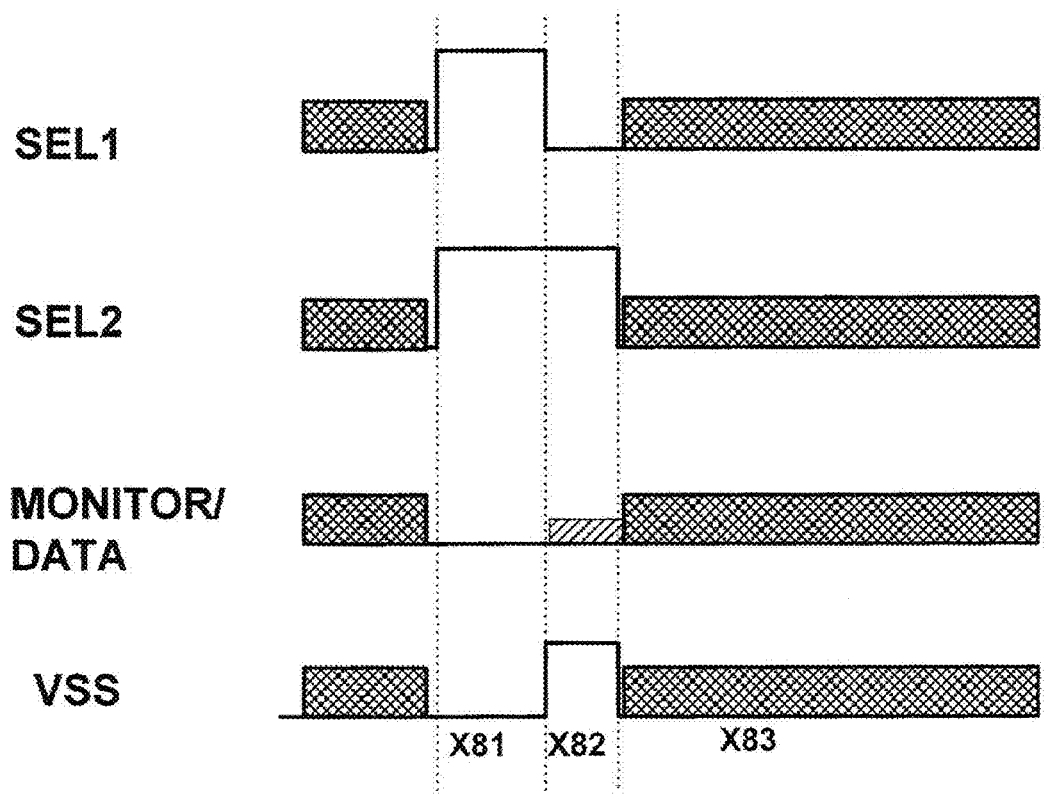
FIG. 19 is a timing diagram showing a further example of waveforms for the voltage/current extraction.
Figure 20:
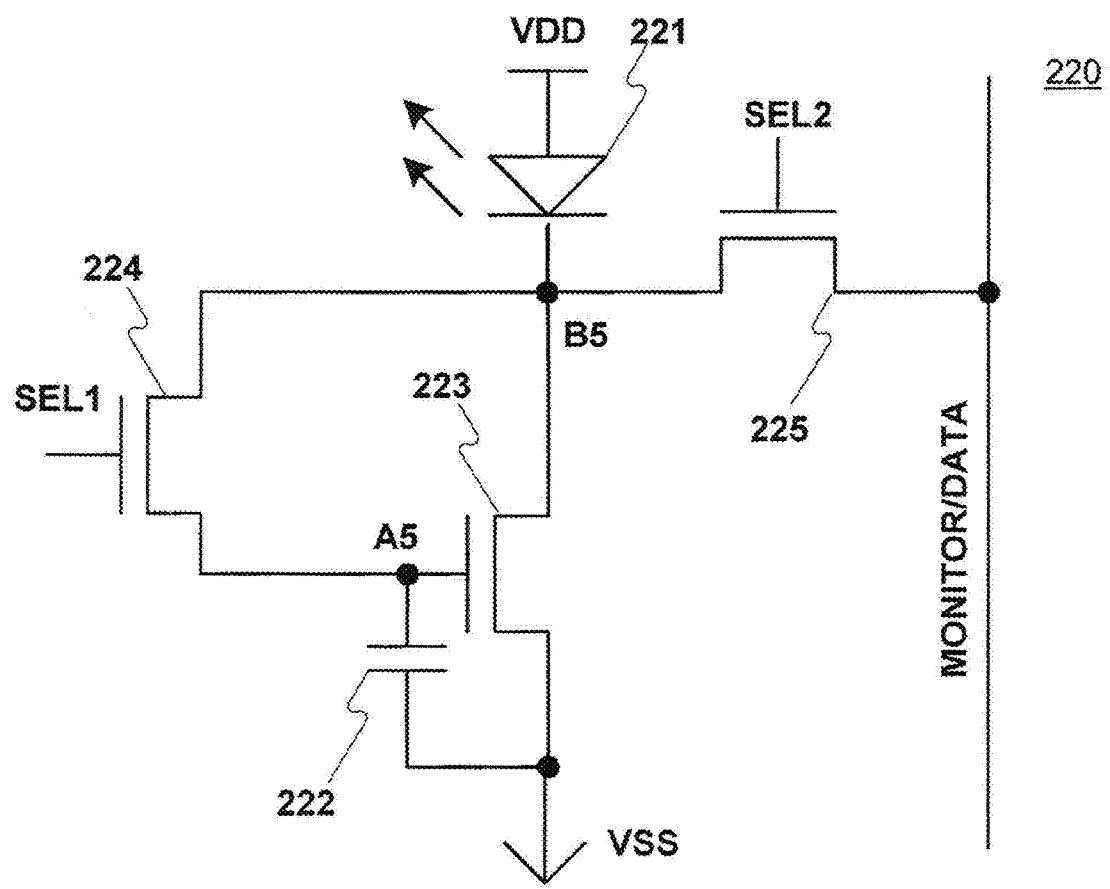
FIG. 20 is a diagram showing a pixel circuit to which the voltage/current extraction of FIG. 19 is applicable.

FIG. 19 illustrates a further example of waveforms for the voltage/current extraction. FIG. 20 illustrates a pixel circuit 220 to which the voltage/current extraction of FIG. 19 is applied.

Referring to FIG. 20, the pixel circuit 220 includes an OLED 221, a storage capacitor 222, and a driving transistor 223 and switch transistors 224 and 225. A plurality of the pixel circuits 220 may form an AMOLED display.

The transistors 223, 224 and 225 are n-type TFTs. However, the transistors 223, 224 and 225 may be p-type TFTs. The voltage/current extraction technique applied to the pixel circuit 220 is also applicable to a pixel circuit having p-type transistors. The transistors 223, 224 and 225 may be fabricated using amorphous silicon, nano/micro crystalline silicon, poly silicon, organic semiconductors technologies (e.g. organic TFT), NMOS/PMOS technology or CMOS technology (e.g. MOSFET).

The gate terminal of the driving transistor 223 is connected to the source terminal of the switch transistor 224, and also connected to the storage capacitor 222. The one terminal of the driving transistor 223 is connected to a common ground. The other terminal of the driving transistor 223 is connected to a monitor and data line MONITOR/DATA through the switch transistor 235, and is also connected to the cathode electrode of the OLED 221.

The gate terminal of the switch transistor 224 is connected to a select line SEL1. The one terminal of the switch transistor 224 is connected to the gate terminal of the driving transistor 223, and is connected to the storage capacitor 222. The other terminal of the switch transistor 224 is connected to the cathode electrode of the OLED 221.

The gate terminal of the switch transistor 225 is connected to a select line SEL2. The one terminal of the switch transistor 225 is connected to MONITOR/DATA. The other terminal of the switch transistor 225 is connected to the driving transistor 223 and the cathode electrode of the OLED 221. The anode electrode of the OLED 221 is connected to a voltage supply electrode or line VDD.

The transistors 223 and 224 and the storage capacitor 222 are connected at node A5. The transistors 223 and 225 and the OLED 221 are connected at node B5.

The pixel circuit 220 is similar to the pixel circuit 160 of FIG. 8. However, in the pixel circuit 220, the MONITOR/DATA line is used for monitoring and programming purpose.

Referring to FIGS. 19-20, the operation of the pixel circuit 220 includes operating cycles X81, X82 and X83.

During the first operating cycle X81, SEL1 and SEL2 are high and MONITOR/DATA is zero. The gate-source voltage of the driving transistor (223 of FIG. 20) becomes zero.

During the second operating cycle X82, a current or voltage is applied to the OLED through the MONITOR/DATA line, and its voltage or current is extracted. As described above, the shift in the OLED voltage is extracted using the algorithm presented in FIG. 10 or 11 based on the monitored voltage or current. This waveform can be combined with any driving waveform.

The operating cycle X83 can be any operating cycle including the programming cycle. This depends on the status of the panel after OLED extraction.

The OLED voltage/current can be extracted during the driving cycle of the pixel circuit 220 of FIG. 20 after it is programmed for a constant current using any driving technique. During the driving cycle the SEL2 goes to a high voltage, and so the voltage of the OLED can be read back through the MONITOR/DATA line for a specific pixel current.

Figure 21:
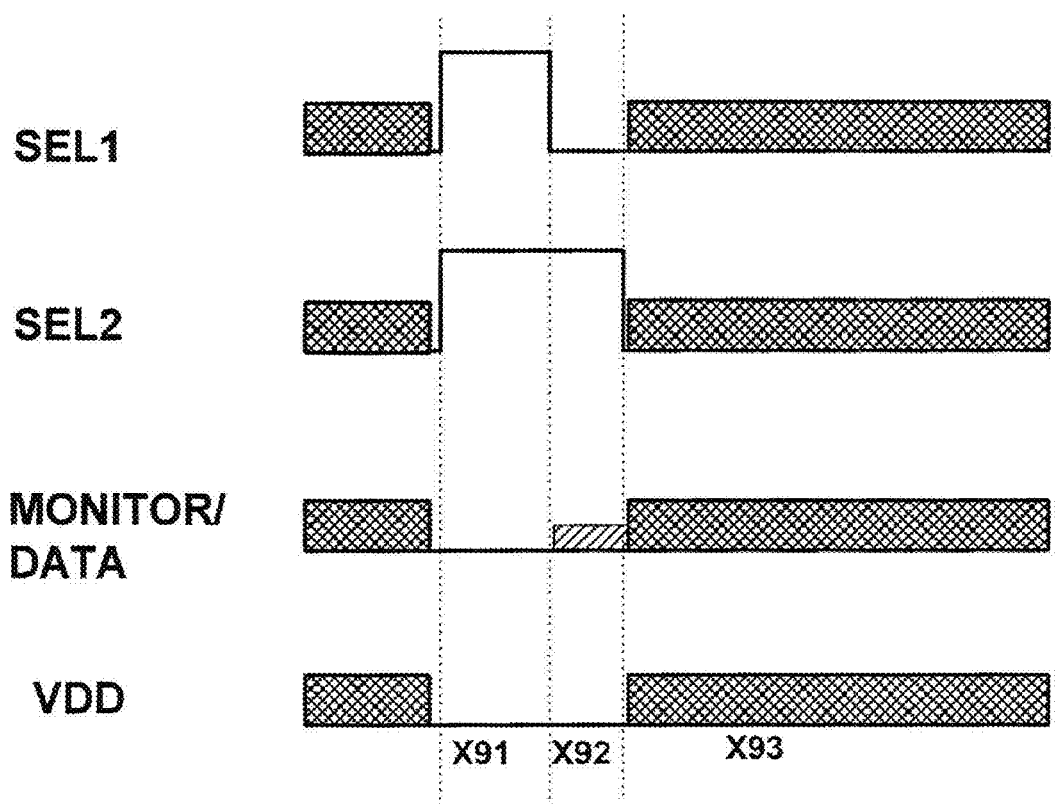
FIG. 21 is a timing diagram showing a further example of waveforms for the voltage/current extraction.
Figure 22:
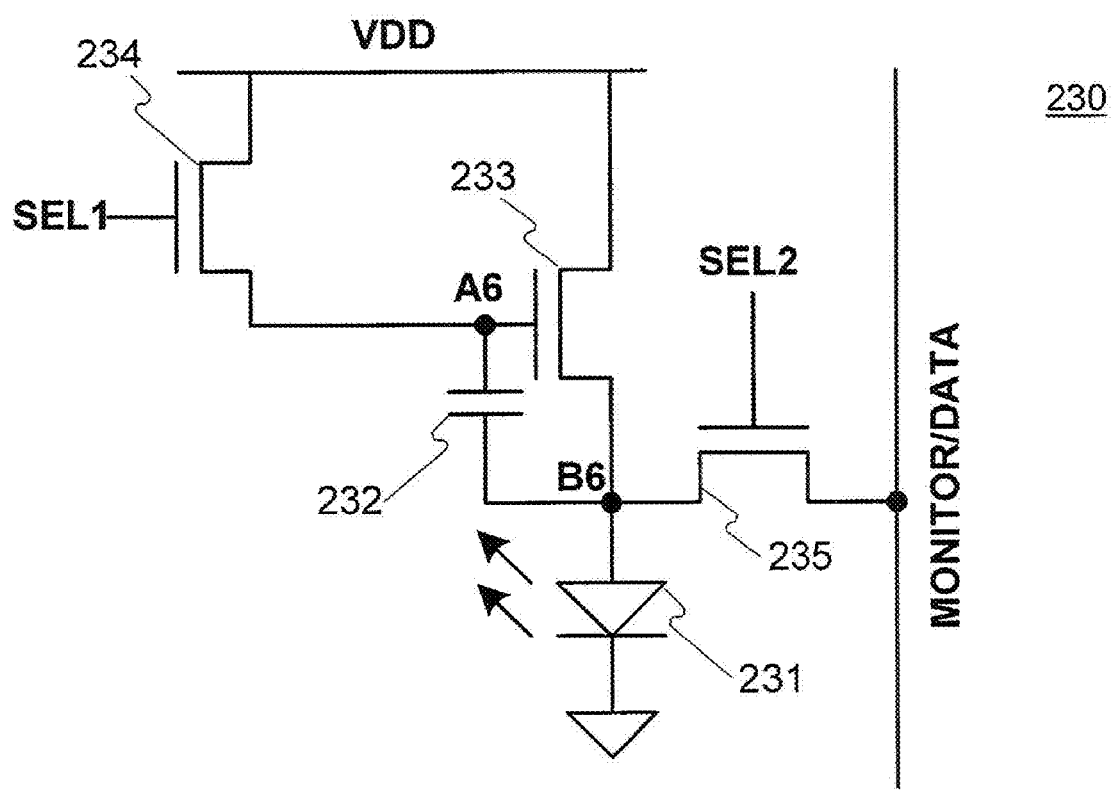
FIG. 22 is a diagram showing a pixel circuit to which the voltage/current extraction of FIG. 21 is applicable.

FIG. 21 illustrates a further example of waveforms for the voltage/current extraction technique. FIG. 22 illustrates a pixel circuit 230 to which the voltage/current extraction of FIG. 21 is applied. The waveforms of FIG. 21 is also applicable to the pixel circuit 160 of FIG. 8 to extract OLED voltage/current.

Referring to FIG. 22, the pixel circuit 230 includes an OLED 231, a storage capacitor 232, and a driving transistor 233 and switch transistors 234 and 235. A plurality of the pixel circuits 230 may form an AMOLED display.

The transistors 233, 234 and 235 are n-type TFTs. However, the transistors 233, 234 and 235 may be p-type TFTs. The voltage/current extraction technique applied to the pixel circuit 230 is also applicable to a pixel circuit having p-type transistors. The transistors 233, 234 and 235 may be fabricated using amorphous silicon, nano/micro crystalline silicon, poly silicon, organic semiconductors technologies (e.g. organic TFT), NMOS/PMOS technology or CMOS technology (e.g. MOSFET).

The gate terminal of the driving transistor 233 is connected to the source terminal of the switch transistor 234, and also connected to the storage capacitor 232. The one terminal of the driving transistor 233 is connected to a voltage supply line VDD. The other terminal of the driving transistor 233 is connected to a monitor and data line MONITOR/DATA through the switch transistor 235, and is also connected to the anode electrode of the OLED 231.

The gate terminal of the switch transistor 234 is connected to a select line SEL1. The one terminal of the switch transistor 234 is connected to the gate terminal of the driving transistor 233, and is connected to the storage capacitor 232. The other terminal of the switch transistor 234 is connected to VDD.

The gate terminal of the switch transistor 225 is connected to a select line SEL2. The one terminal of the switch transistor 235 is connected to MONITOR/DATA. The other terminal of the switch transistor 235 is connected to the driving transistor 233 and the anode electrode of the OLED 231. The anode electrode of the OLED 231 is connected to VDD.

The transistors 233 and 234 and the storage capacitor 232 are connected at node A6. The transistors 233 and 235 and the OLED 231 are connected at node B5.

The pixel circuit 230 is similar to the pixel circuit 190 of FIG. 14. However, in the pixel circuit 230, the MONITOR/DATA line is used for monitoring and programming purpose.

Referring to FIGS. 21-22, the operation of FIG. 22 includes operating cycles X91, X92 and X93.

During the first operating cycle X91, SEL1 and SEL2 are high and VDD goes to zero. The gate-source voltage of the driving transistor (e.g. 233 of FIG. 21) becomes zero.

During the second operating cycle X92, a current (voltage) is applied to the OLED (e.g. 231 of FIG. 21) through the MONITOR/DATA line, and its voltage (current) is extracted. As described above, the shift in the OLED voltage is extracted using the algorithm presented in FIG. 10 or 11 based on the monitored voltage or current. This waveform can be combined with any other driving waveform.

The operating cycle X93 can be any operating cycle including the programming cycle. This depends on the status of the panel after OLED extraction.

The OLED voltage can be extracted during the driving cycle of the pixel circuit 230 of FIG. 21 after it is programmed for a constant current using any driving technique. During the driving cycle the SEL2 goes to a high voltage, and so the voltage of the OLED can be read back through the MONITOR/DATA line for a specific pixel current.

As reported, the OLED characteristics improve under negative bias stress. As a result, a negative bias related to the stress history of the pixel, extracted from the OLED voltage/current, can be applied to the OLED during the time in which the display is not operating. This method can be used for any pixel circuit presented herein.

Using the OLED voltage/current extraction technique, a pixel circuit can provide stable brightness that is independent of pixel aging under prolonged display operation, to efficiently improve the display operating lifetime.

A technique for reducing the unwanted emission in a display array having a light emitting device in accordance with an embodiment of the present invention is described in detail. This technique includes removing OLED from a programming path during a programming cycle. This technique can be adopted in hybrid driving technique to extract information on the precise again of a pixel, e.g. the actual threshold voltage shift/mismatch of the driving transistor. The light emitting device is turned off during the programming/calibration cycle so that it prevents the unwanted emission and effect of the light emitting device on the pixel aging. This technique can be applied to any current mirror pixel circuit fabricated in any technology including poly silicon, amorphous silicon, crystalline silicon, and organic materials.

Figure 23:
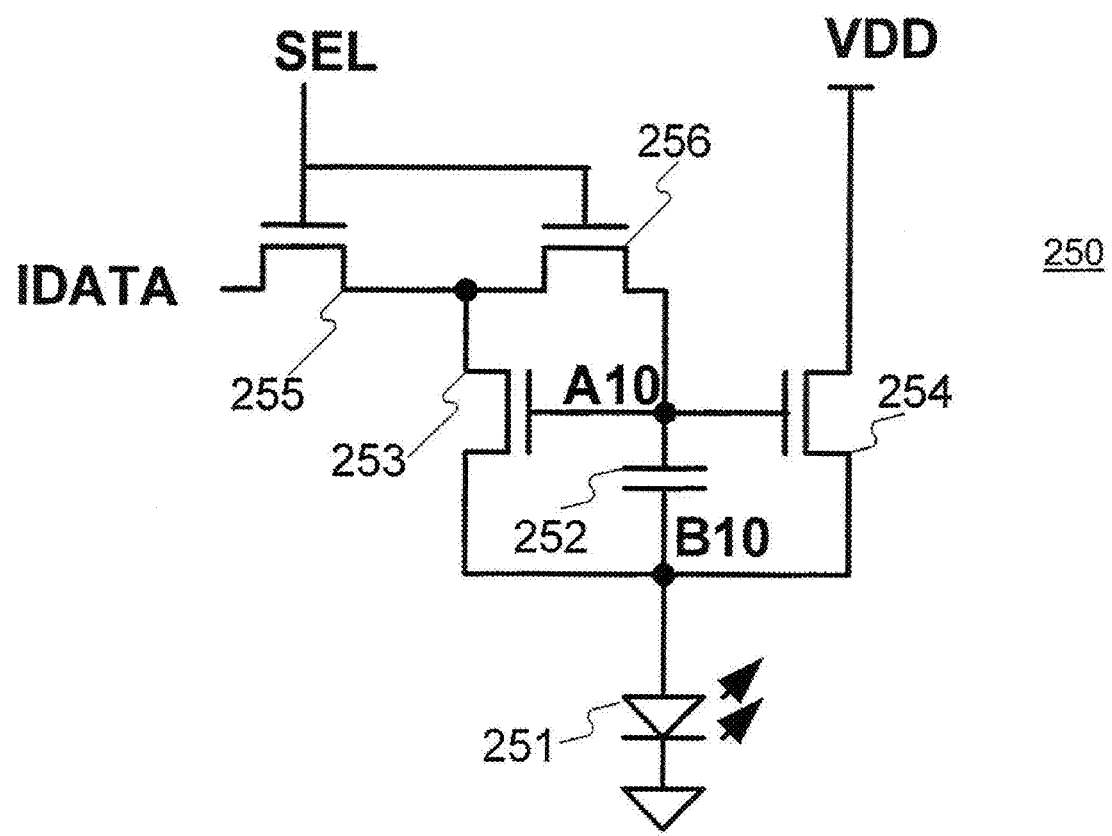
FIG. 23 is a diagram showing a mirror based pixel circuit to which OLED removing in accordance with an embodiment of the present invention is applied.

FIG. 23 illustrates a mirror based pixel circuit 250 to which a technique for removing OLED from a programming path during a programming cycle is applied. The pixel circuit 250 includes an OLED 251, a storage capacitor 252, a programming transistor 253, a driving transistor 254, and switch transistors 255 and 256. The gate terminals of the transistors 253 and 254 are connected to IDATA through the switch transistors 255 and 256.

The transistors 253, 254, 255 and 256 are n-type TFTs. However, the transistors 253, 254, 255 and 256 may be p-type TFTs. The OLED removing technique applied to the pixel circuit 250 is also applicable to a pixel circuit having p-type transistors. The transistors 253, 254, 255 and 256 may be fabricated using amorphous silicon, nano/micro crystalline silicon, poly silicon, organic semiconductors technologies (e.g. organic TFT), NMOS/PMOS technology or CMOS technology (e.g. MOSFET).

The transistors 253, 254 and 256 and the storage capacitor 252 are connected at node A10. The transistors 253 and 254, the OLED 251 and the storage capacitor 252 are connected at node B10.

In the conventional current programming, SEL goes high, and a programming current (IP) is applied to IDATA. Considering that the width of the mirror transistor 253 is "m" times larger than the width of the mirror transistor 254, the current flowing through the OLED 251 during the programming cycle is (m+1)IP. When "m" is large to gain significant speed improvement, the unwanted emission may become considerable.

Figure 24:
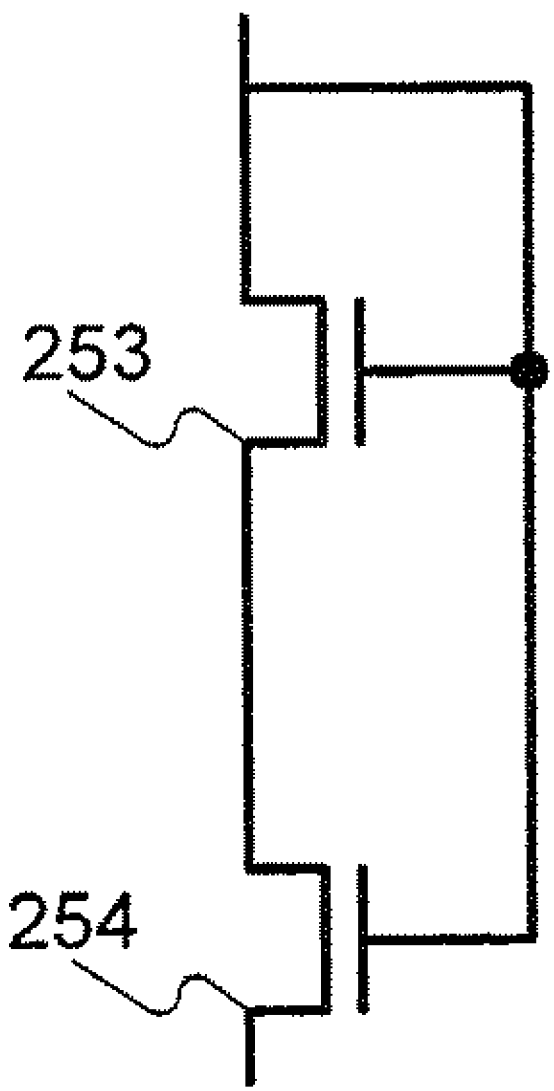
FIG. 24 is a diagram showing a programming path of FIG. 23 when applying the OLED removing.

By contrast, according to the OLED removing technique, VDD is brought into a lower voltage. This ensures the OLED 251 to be removed from a programming path as shown in FIG. 24.

During a programming cycle, SEL is high and VDD goes to a reference voltage (Vref) in which the OLED 251 is reversely biased. Therefore, the OLED 251 is removed from the current path during the programming cycle.

During the programming cycle, the pixel circuit 250 may be programmed with scaled current through IDATA without experiencing unwanted emission.

During the programming cycle, the pixel circuit 250 may be programmed with current and using one of the techniques describe above. The voltage of the IDATA line is read back to extract the threshold voltage of the mirror transistor 253 which is the same as threshold voltage of the driving transistor 254.

Also, during the programming cycle, the pixel circuit 250 may be programmed with voltage through the IDATA line, using one of the techniques describe above. The current of the IDATA line is read back to extract the threshold voltage of the mirror transistor 253 which is the same as threshold voltage of the driving transistor 254.

The reference voltage Vref is chosen so that the voltage at node B10 becomes smaller than the ON voltage of the OLED 251. As a result, the OLED 251 turns off and the unwanted emission is zero. The voltage of the IDATA line includes $$V_P + V_T + \Delta V_T \quad (3)$$

where $V_P$ includes the drain-source voltage of the driving transistor 254 and the gate-source voltage of the transistor 253, $V_T$ is the threshold voltage of the transistor 253 (254), and $\Delta VT$ is the $V_T$ shift/mismatch.

At the end of the programming cycle, VDD goes to its original value, and so voltage at node B10 goes to the OLED voltage VOLED. At the driving cycle, SEL is low. The gate voltage of the transistor 254/253 is fixed and stored in the storage capacitor 252, since the switch transistors 255 and 256 are off. Therefore, the pixel current during the driving cycle becomes independent of the threshold voltage $V_T$.

The OLED removing technique can be adopted in hybrid driving technique to extract the $V_T$-shift or $V_T$-mismatch. From (3), if the pixel is programmed with the current, the only variant parameter in the voltage of the IDATA line is the $V_T$ shift/mismatch ($\Delta VT$). Therefore, $\Delta VT$ can be extracted and the programming data can be calibrated with $\Delta VT$.

Figure 25:
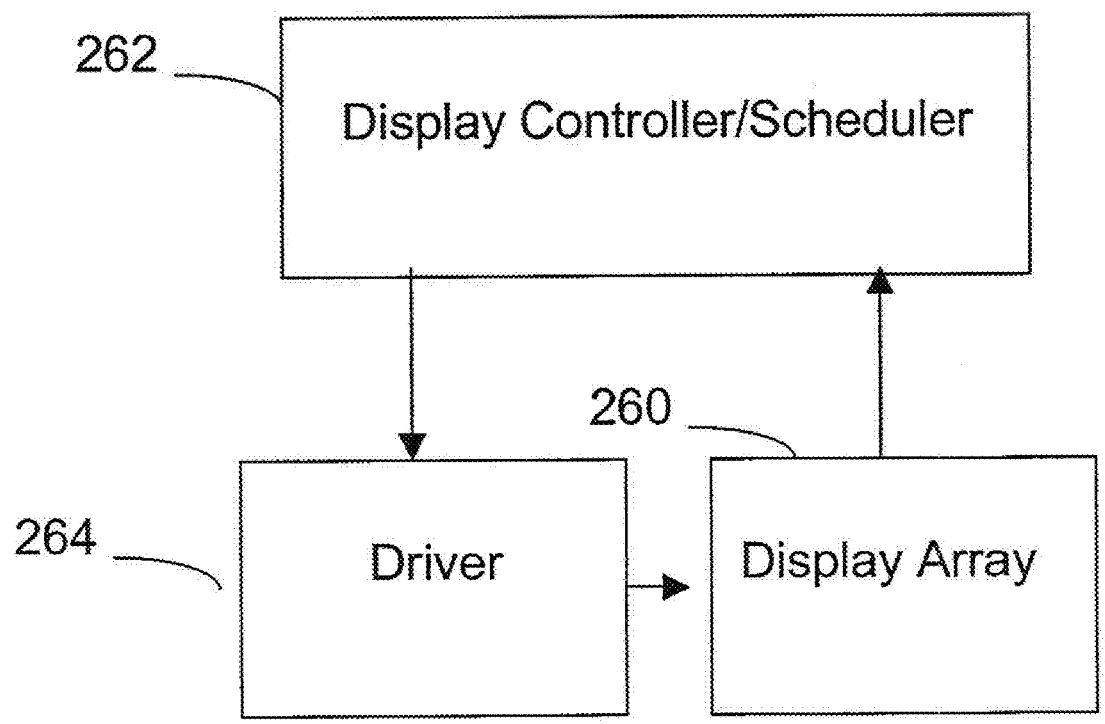
FIG. 25 is a diagram showing an example of a system architecture for the OLED removing.

FIG. 25 illustrates an example of a system architecture for implementing the OLED removing technique. A display array 260 includes a plurality of pixel circuits, e.g. pixel circuit 250 of FIG. 26. A display controller and scheduler 262 controls and schedules the operation of the display array 260. A driver 264 provides operation voltages to the pixel circuit. The driver provides the operation voltage(s) to the pixel circuit based on instructions/commands from the display controller and scheduler 262 such that the OLED is removed from a programming path of the pixel circuit, as described above.

The controller and scheduler 262 may include functionality of the display controller and scheduler 64 of FIG. 3, or may include functionality of the data process and calibration unit 206 of FIG. 16. The system of FIG. 25 may have any of these functionalities, the calibration-scheduling described above, the voltage/current extraction described above, or combinations thereof.

Figure 26:
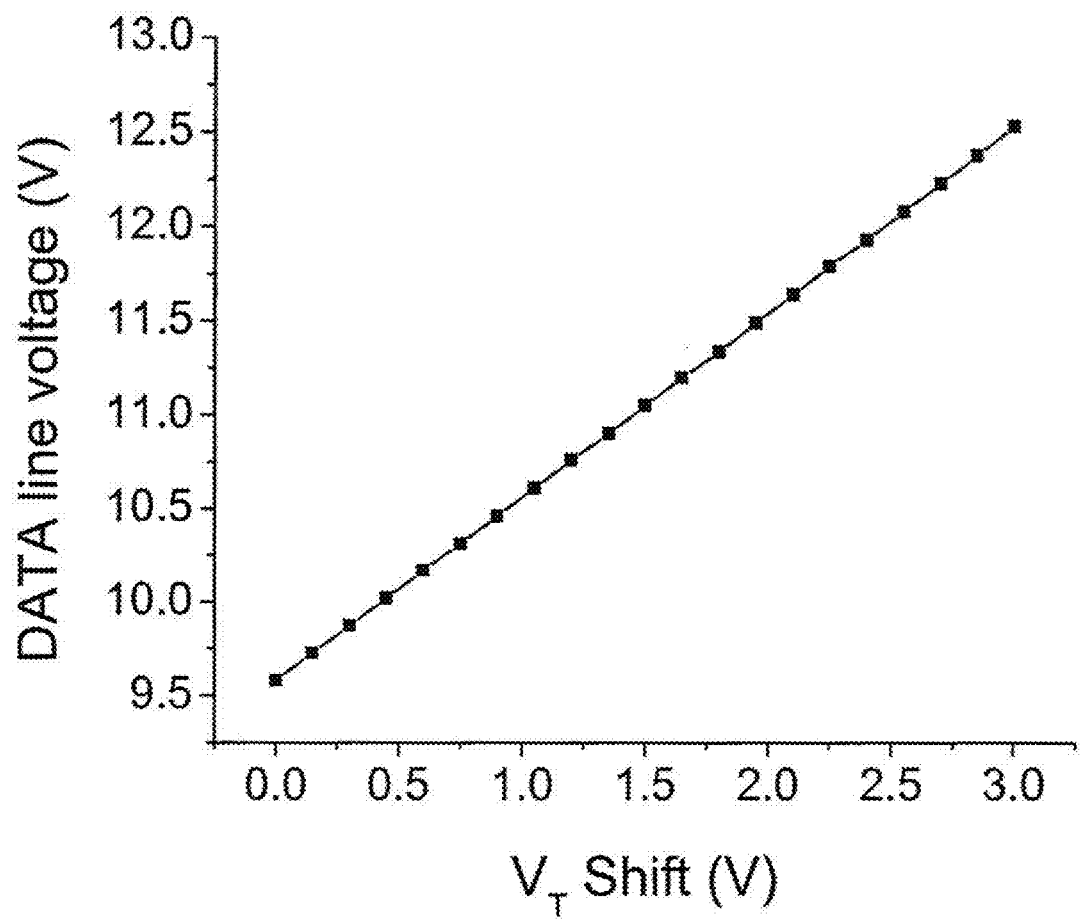
FIG. 26 is a graph showing the simulation result for the voltage on IDATA line for different threshold voltage.

The simulation result for the voltage on IDATA line for different $V_T$ is illustrated in FIG. 26. Referring to FIGS. 23-26, the voltage of the IDATA line includes the shift in the threshold voltage of the transistors 253 and 254. The programming current is 1 µA.

The unwanted emission is reduced significantly resulting in a higher resolution. Also, individual extraction of circuit aging and light emitting device aging become possible, leading in a more accurate calibration.

It is noted that each of the transistors shown in FIGS. 4-8,14, 20, 21, 23 and 24 can be replaced with a p-type transistor using the concept of complementary circuits.

All citations are hereby incorporated by reference.

The present invention has been described with regard to one or more embodiments. However, it will be apparent to persons skilled in the art that a number of variations and modifications can be made without departing from the scope of the invention as defined in the claims.

What is claimed is:

1. A system for a display array having a pixel circuit, the pixel circuit being programmed through a data line, the system comprising:
    a data source for providing a programming data into the pixel circuit;
    a current-controlled voltage source associated with the data source for converting a current on the data line to a voltage associated with the current to extract a time dependent parameter of the pixel circuit; and
    a current conveyor for extracting the current of the data line, the current conveyor including X, Y, and Z terminals, the data source applying a programming voltage to the Y terminal, the X terminal being connected to the data line and being forced by feedback to have the same voltage as that of the Y terminal, the current of the X terminal being duplicated to the Z terminal which is connected to the current-controlled voltage source.

2. The system according to claim 1, further comprising:
    a controller for determining the time dependent parameter of the pixel circuit based on the voltage associated with the current.

3. The system according to claim 1, wherein the pixel circuit includes a current mirror.

4. The system according to claim 3, wherein the pixel circuit includes:
    first and second mirror transistors, each having a gate terminal, a first terminal and a second terminal;
    first and second switch transistors, each having a gate terminal, a first terminal and a second terminal;
    a storage capacitor; and
    a light emitting device,
    wherein the first terminal of the first mirror transistor is connected to the data line through the first switch transistor and is connected to the storage capacitor through the second switch transistor, the second terminal of the first mirror transistor is connected to the storage capacitor and the light emitting device, the gate terminals of the first and second mirror transistors are connected to the storage capacitor and are connected to the data line through the first and second switch transistors, the first terminal of the second mirror transistor is connected to a voltage supply line, the second terminal of the second mirror transistor is connected to the storage capacitor and the light emitting device.

5. The system according to claim 3, wherein the pixel circuit includes:
  first and second mirror transistors, each having a gate terminal, a first terminal and a second terminal;
  first and second switch transistors, each having a gate terminal, a first terminal and a second terminal;
  a storage capacitor; and
  a light emitting device,
  wherein the first terminal of the first mirror transistor is connected to the data line through the first switch transistor and is connected to the storage capacitor through the second switch transistor, the gate terminals of the first and second mirror transistors are connected to the storage capacitor and are connected to the data line through the first and second switch transistors, and the first terminal of the second mirror transistor is connected to the light emitting device.

6. The system according to claim 1, wherein the display array is an AMOLED array.

7. The system according to claim 1, wherein the pixel circuit includes a driving transistor connected in series with a light emitting device, and wherein the extracted time dependent parameter of the pixel circuit includes a threshold voltage of the driving transistor.

8. The system according to claim 7, wherein the extracted time dependent parameter of the pixel circuit also includes a turn on voltage of the light emitting device.

9. The system according to claim 7, wherein the programming data provided to the pixel circuit via the data source is modified according to the extracted time dependent parameter.

10. The system according to claim 1, wherein the pixel circuit is programmed via a voltage modified according to the extracted time dependent parameter.

11. The system according to claim 1, wherein the pixel circuit includes a driving transistor connected in series with a light emitting device, a storage capacitor connected to a gate terminal of the driving transistor, and wherein the pixel circuit is programmed by applying the programming voltage on the data line, via the current conveyor, the programming voltage corresponding to the programming data, and wherein the pixel circuit is configured such that the current on the data line, conveyed to the current-controlled voltage source via the current conveyor, is the current through the driving transistor while the programming voltage is applied.

12. The system according to claim 11, wherein the extracted time dependent parameter is a threshold voltage of the driving transistor and is determined according to a function including the voltage associated with the current provided by the current-controlled voltage source and the programming voltage.

13. The system according to claim 12, wherein the data source is operated to calibrate a subsequent programming voltage according to the extracted time dependent parameter.

14. The system according to claim 1, wherein the data source is operated to calibrate a subsequent programming voltage according to the extracted time dependent parameter.

15. The system according to claim 1, wherein the pixel circuit includes:
  a driving transistor having a gate terminal, a first terminal, and a second terminal;
  a storage capacitor connected to the gate terminal of the driving transistor;
  a light emitting device to the first terminal of the driving transistor;
  a first switch transistor connecting the first terminal of the driving transistor to the data line; and
  a second switch transistor connecting the first terminal of the driving transistor to the gate terminal of the driving transistor.

16. The system according to claim 1, wherein the pixel circuit includes:
  a driving transistor having a gate terminal, a first terminal, and a second terminal;
  a storage capacitor connected to the second terminal of the driving transistor;
  a light emitting device to the first terminal of the driving transistor;
  a first switch transistor connecting the second terminal of the driving transistor to the data line; and
  a second switch transistor connecting the second terminal of the driving transistor to the gate terminal of the driving transistor.

17. A system for a display array including a plurality of pixel circuits, each pixel circuit including a driving transistor, at least one switch transistor, a storage capacitor and a light emitting device, the system comprising:
  a monitor for monitoring a current or voltage on at least one pixel circuit of the plurality of pixel circuits;
  a driver for providing programming and calibration data to the at least one pixel circuit; and
  a data process unit for controlling the driver to operate the display array, the data process unit extracting aging information of the at least one pixel circuit, based on the monitored current or voltage, and wherein the data process unit estimates an intermediate threshold voltage of the at least one pixel circuit according to a previous extracted threshold voltage, or a combination of the previous extracted threshold voltage and a resolution of the driver.

18. The system according to claim 17, wherein the data process unit determines a state of the at least one pixel circuit based on a comparison of the monitored current or voltage with a reference value, and wherein the data process unit estimates the intermediate threshold voltage based on the state of the at least one pixel circuit.

19. The system according to claim 17, wherein the driver provides a programming voltage determined based on the previous extracted threshold voltage and a programming data.

20. The system according to claim 17, wherein the driver provides a calibration voltage determined based on the intermediate threshold voltage and a bias voltage.

21. The system according to claim 17, wherein the monitor senses the current through a monitor line connected to the at least one pixel circuit.

22. The system according to claim 21, wherein the switch transistor includes first and second switch transistors,
  each of the driving transistor, the first switch transistor and the second switch transistor including a gate terminal, a first terminal and a second terminal, and
  the gate terminal of the driving transistor being connected to a signal line through the first switch transistor and being connected to the storage capacitor, the first terminal of the driving transistor being connected to the light emitting device and being connected to the monitor line through the second switch transistor.

23. The system according to claim 22, wherein the gate terminals of the first and second switch transistors are connected to a common select line.

24. The system according to claim 22, wherein the gate terminals of the first and second switch transistors are connected to first and second select lines.

25. The system according to claim 17, wherein the system implements, to pixel circuits in each row of the display array, one extraction operation for extracting the threshold voltages of the driving transistors in the pixel circuits during a frame time.

26. The system according to claim 17, wherein the at least one pixel circuit includes:
a first switch transistor connected to a data line conveying the programming and calibration data from the driver; and
a second switch transistor connected to a monitor line conveying the current or voltage to the monitor.

27. The system according to claim 26, wherein the storage capacitor is connected to a gate terminal of the driving transistor, the gate terminal of the driving transistor being connected to the data line through the first switch transistor, and wherein the light emitting device is connected to a first terminal of the driving transistor, the first terminal of the driving transistor being connected to the monitor line through the second switch transistor.

28. The system according to claim 27, wherein the first switch transistor is operated according to a first select line connected to a gate terminal of the first switch transistor, and the second switch transistor is operated according to a second select line connected to a gate terminal of the second switch transistor, and
wherein the data process unit is further configured to operate the first and second select lines to provide:
a first phase of an extraction cycle while both the first and second switch transistors are turned on by the first and second select lines and the gate terminal of the driving transistor is charged to a calibration voltage provided via the data line while the first terminal of the driving transistor is charged to a reference voltage provided via the monitor line, the reference voltage being sufficient to reverse bias the light emitting device;
a second phase of the extraction cycle while the first switch transistor is turned off by the first select line and a gate-source voltage of the driving transistors accounts for dynamic effects and the second switch transistor is turned on by the second select line to allow the monitor to detect current through the drive transistor;
a programming cycle while the first switch transistor is turned on by the first select line and a programming voltage is applied to the data line; and
a driving cycle while first switch transistor is turned off by the first select line and the driving transistor is driven according to the programming information such that a pixel current provided to the light emitting device is independent of the threshold voltage.

29. The system according to claim 27, wherein the first switch transistor is operated according to a first select line connected to a gate terminal of the first switch transistor, and the second switch transistor is operated according to a second select line connected to a gate terminal of the second switch transistor, and
wherein the data process unit is further configured to operate the first and second select lines to provide:
a programming cycle while the first and second switch transistors are turned on by the first and second select lines and a programming voltage is applied to the data line;
an extraction cycle while the second switch transistor is turned on by the second select line to allow the monitor to detect current through the drive transistor; and
a driving cycle while the first switch transistor is turned off by the first select line and the driving transistor is driven according to the programming information such that a pixel current provided to the light emitting device is independent of the threshold voltage.

30. The system according to claim 27, wherein the first switch transistor is operated according to a first select line connected to a gate terminal of the first switch transistor, and the second switch transistor is operated according to a second select line connected to a gate terminal of the second switch transistor, and
wherein the data process unit is further configured to operate the first and second select lines to provide:
a first phase of an extraction cycle while the first and second switch transistors are turned on by the first and second select lines are turned on and the data line is set to turn off the driving transistor, and a current or voltage is applied to the light emitting device via the monitor line; and
a second phase of an extraction cycle while the second switch transistor is turned on by the second select line and the voltage or current of the light emitting device is measured to extract a shift in the operating voltage of the light emitting device.

31. The system according to claim 17, wherein the monitor includes at least one of a current sense amplifier or a current comparator.

32. The system according to claim 17, wherein the data process unit is further configured to:
extract aging information for each of the plurality of pixel circuits in the display array based on monitored current or voltage monitored from each of the plurality of pixel circuits, and
provide programming information to each of the plurality of pixel circuits, wherein the programming information provided to each of the plurality of pixel circuits is calibrated according to the extracted aging information.

33. The system according to claim 17, wherein the monitor detects a voltage of the light emitting device during an emission operation for the at least one pixel circuit and the extracted aging information includes an operating voltage of the light emitting device.

34. The system according to claim 17, wherein the monitor detects a current of the driving transistor during a calibration cycle separate from a driving cycle while the pixel current is driven to emit light.

35. The system according to claim 17, wherein the data process unit incrementally estimates the intermediate threshold voltage of the driver by:
comparing the monitored current or voltage with a reference value,
determining, based on the comparison, whether the threshold voltage of the at least one pixel circuit is greater than, equal to, or lesser than, a previous estimated threshold voltage, and
setting the intermediate threshold voltage to:
the previous estimated threshold voltage incremented by the resolution of the driver responsive to determining that the threshold voltage is greater than the previous estimated threshold voltage;

the previous estimated threshold voltage responsive to determining that the threshold voltage is equal to the previous estimated threshold voltage; or the previous estimated threshold voltage decremented by the resolution of the driver responsive to determining that the threshold voltage is lesser than the previous estimated threshold voltage.

36. The system according to claim 17, wherein the data process unit incrementally estimates the intermediate threshold voltage of the driver by comparing the monitored current or voltage with a reference value and determining, based on the comparison, an amount to add or subtract to a previous estimated threshold voltage to set the intermediate threshold voltage, and wherein the amount to add or subtract is dynamically determined based on the rate of change of the threshold voltage.

37. The system according to claim 17, wherein the data process unit operates the monitor and the driver to:

program the display, via the data line, during a programming cycle;

drive the display to emit light, during an emission cycle; and extract the aging information during an extraction cycle that is carried out on an extraction interval that is greater than a display refresh time such that multiple driving and programming operations are carried out between extraction cycles for each pixel circuit.

38. A system for a display array including a plurality of pixel circuits arranged in a plurality of rows, each pixel circuit including a driving transistor, at least one switch transistor, a storage capacitor and a light emitting device, the system comprising:

a monitor for monitoring a current or voltage on each of the plurality of pixel circuits;

a driver for providing programming and calibration data to each of the plurality of pixel circuits; and a data process unit for controlling the driver to operate the display array, the data process unit extracting aging information for each of the plurality of pixel circuits, based on the monitored current or voltage, and wherein the system consecutively implements, to pixel circuits in each row of the display array:

an extraction operation for extracting estimated threshold voltages of the driving transistors in the pixel circuits in a row, a programming operation for programming the pixel circuits in the row, and a driving operation for driving the pixel circuits in the row.

39. The system according to claim 38, wherein each pixel circuit includes:

a first switch transistor connected to a data line conveying the programming and calibration data from the driver; and a second switch transistor connected to a monitor line conveying the current or voltage to the monitor.

40. The system according to claim 39, wherein the storage capacitor is connected to a gate terminal of the driving transistor, the gate terminal of the driving transistor being connected to the data line through the first switch transistor, and wherein the light emitting device is connected to a first terminal of the driving transistor, the first terminal of the driving transistor being connected to the monitor line through the second switch transistor.

41. The system according to claim 38, wherein the data process unit is operated to calibrate programming voltages for each pixel circuit based on the extracted aging information.

42. The system according to claim 38, wherein the extraction operation includes a one-bit extraction technique.

43. The system according to claim 38, wherein the extraction operation includes comparing the monitored current or voltage of each pixel circuit in the row to a reference value and adjusting a previously estimated threshold voltage of pixels in the row, based on the comparison.

44. The system according to claim 38, wherein each pixel circuit includes:

a first switch transistor connecting a first terminal of the driving transistor to a shared monitor and data line connected to both the driver and the monitor; and a second switch transistor connected between a gate terminal of the driving transistor and the first terminal of the driving transistor, and wherein the light emitting device is connected to the first terminal of the driving transistor, and the storage capacitor is connected to a gate terminal of the driving transistor.

45. The system according to claim 38, wherein each pixel circuit includes:

a first switch transistor connecting a first terminal of the driving transistor to a shared monitor and data line connected to both the driver and the monitor; and a second switch transistor connected between a gate terminal of the driving transistor and a second terminal of the driving transistor, and wherein the light emitting device is connected to the first terminal of the driving transistor, and the storage capacitor is connected between the gate terminal of the driving transistor and the first terminal of the driving transistor.

46. A method of driving a display array, the display array including a plurality of pixel circuits, each of the plurality of pixel circuits including a driving transistor, at least one switch transistor, a storage capacitor and a light emitting device, the method comprising:

applying a current or voltage to at least one pixel circuit of the plurality of pixel circuits;

monitoring a current or voltage flowing through the pixel circuit;

extracting aging information of the at least one pixel circuit, based on the monitored current or voltage, by estimating an intermediate threshold voltage of the at least one pixel circuit according to a previous extracted threshold voltage, or a combination of the previous extracted threshold voltage and a resolution of a driver for programming the at least one pixel circuit;

providing an operation voltage to the at least one pixel circuit according to programming and calibration data for the at least one pixel circuit, the calibration data being based on the extracted aging information of the at least one pixel circuit.

47. The method according to claim 46, wherein the extracting includes determining a state of the at least one pixel circuit by comparing the monitored current or voltage with a reference value and estimating the intermediate threshold voltage based on the state of the at least one pixel circuit.

48. The method according to claim 46, further comprising determining a programming voltage for the programming based on the previous extracted threshold voltage and a programming data.

49. The method according to claim 46, further comprising determining a calibration voltage for the calibration based on the intermediate threshold voltage and a bias voltage.

50. The method according to claim 46, wherein the extracting includes:
  comparing the monitored current or voltage with a reference value,
  determining, based on the comparison, whether the threshold voltage of the at least one pixel circuit is greater than, equal to, or lesser than, a previous estimated threshold voltage, and
  setting the intermediate threshold voltage to:
    the previous estimated threshold voltage incremented by the resolution of the driver responsive to determining that the threshold voltage is greater than the previous estimated threshold voltage;
    the previous estimated threshold voltage responsive to determining that the threshold voltage is equal to the previous estimated threshold voltage; or
    the previous estimated threshold voltage decremented by the resolution of the driver responsive to determining that the threshold voltage is lesser than the previous estimated threshold voltage.

51. The method according to claim 46, wherein the extracting includes:
  comparing the monitored current or voltage with a reference value and determining, based on the comparison, an amount to add or subtract to a previous estimated threshold voltage to set the intermediate threshold voltage, wherein the amount to add or subtract is dynamically determined based on the rate of change of the threshold voltage.

52. A system for a display array including a plurality of pixel circuits, each of the plurality of pixel circuits having a driving transistor, at least one switch transistor, a storage capacitor and a light emitting device, the light emitting device being located at a programming path for programming the pixel circuit, the system comprising:
  a controller for controlling the operation of the display array;
  a driver for providing an operation voltage to at least one pixel circuit of the plurality of pixel circuits based on the control of the controller; and
  the driver providing the operation voltage to the at least one pixel circuit during a programming cycle such that the light emitting device is removed from the programming path.

53. The system according to claim 52, wherein the driver provides the operation voltage to the at least one pixel circuit during the programming cycle such that the light emitting device is reversely biased.

54. The system according to claim 52, wherein the at least one pixel circuit comprises a programming transistor, the at least one switch transistor comprises a first switch transistor and a second switch transistor,
  gate terminals of the first switch transistor and the second switch transistor being connected to a select line, the first switch transistor and the second switch transistor being connected in series between a data line and a gate terminal of the driving transistor,
  a gate terminal of the programming transistor being connected to the gate terminal of the driving transistor, the programming transistor being connected between the light emitting device and a connection point between the first switch transistor and the second switch transistor,
  the storage capacitor being connected between the gate terminal of the driving transistor and the light emitting device,
  the driving transistor being connected between a supply line and the light emitting device.

55. The system according to claim 52, further comprising an adjustable power supply line for applying a reference voltage sufficient to reverse bias the light emitting device.

56. A method of driving a display array including a pixel circuit programmed through a data line and a current conveyor for extracting a current of the data line, the current conveyor including X, Y, and Z terminals, the X terminal connected to the data line and being forced by feedback to have the same voltage as that of the Y terminal, the current of the X terminal being duplicated to the Z terminal, the method comprising:
  providing programming data to the pixel circuit via a data source applying a programming voltage to the Y terminal of the current conveyor;
  converting a current on the data line to a voltage associated with the current to extract a time dependent parameter of the pixel circuit via a current-controlled voltage source associated with the data source; and
  extracting the current of the data line via the current-controlled voltage source connected to the Z terminal of the current conveyor.

57. The method according to claim 56, further comprising:
  calibrating a subsequent programming voltage according to the extracted time dependent parameter; and
  providing subsequent programming data to the pixel circuit via the data source applying the calibrated programming voltage to the Y terminal of the current conveyor.

58. A method of driving a display array including a plurality of pixel circuits arranged in a plurality of rows, each of the plurality of pixel circuits including a driving transistor, at least one switch transistor, a storage capacitor, and a light emitting device, the method comprising:
  consecutively implementing, to pixel circuits in each row of the display array:
    monitoring a current or voltage on pixel circuits in a row;
    extracting aging information for the pixel circuits in the row, based on the monitored current or voltage during an extraction operation;
    programming the pixel circuits in the row according to programming and calibration data during a programming operation; and
    driving the pixel circuits in the row during a driving operation.

59. The method according to claim 58, wherein the extracting includes:
  comparing the monitored current or voltage with a reference value,
  determining, based on the comparison, whether the threshold voltage of the at least one pixel circuit is greater than, equal to, or lesser than, a previous estimated threshold voltage, and
  setting the intermediate threshold voltage to:
    the previous estimated threshold voltage incremented by the resolution of the driver responsive to determining that the threshold voltage is greater than the previous estimated threshold voltage;
    the previous estimated threshold voltage responsive to determining that the threshold voltage is equal to the previous estimated threshold voltage; or
    the previous estimated threshold voltage decremented by the resolution of the driver responsive to determining that the threshold voltage is lesser than the previous estimated threshold voltage.

60. The method according to claim 58, wherein the extracting includes:
comparing the monitored current or voltage with a reference value and determining, based on the comparison, an amount to add or subtract to a previous estimated threshold voltage to set the intermediate threshold voltage, wherein the amount to add or subtract is dynamically determined based on the rate of change of the threshold voltage.

61. A method of driving a display array including a plurality of pixel circuits each having a driving transistor, at least one switch transistor, a storage capacitor, and a light emitting device, the light emitting device being located at a programming path for programming the pixel circuit, the method comprising:
providing an operation voltage to each of the plurality of pixel circuits via a driver operated based on the control of a controller, during a programming cycle; and
removing the light emitting device from the programming path during the programming cycle by setting a voltage supply line to a reference voltage.

* * * * *